(12) United States Patent
Shishido et al.

(10) Patent No.: US 6,913,861 B2
(45) Date of Patent: Jul. 5, 2005

(54) METHOD OF OBSERVING EXPOSURE CONDITION FOR EXPOSING SEMICONDUCTOR DEVICE AND ITS APPARATUS AND METHOD OF MANUFACTURING SEMICONDUCTOR DEVICE

(75) Inventors: Chie Shishido, Yokohama (JP); Osamu Komuro, Hitachinaka (JP); Hidetoshi Morokuma, Hitachinaka (JP); Ryo Nakagaki, Kawasaki (JP); Maki Tanaka, Yokohama (JP); Yuuji Takagi, Kamakura (JP)

(73) Assignee: Hitachi High-Technologies Corporation, Tokyo (JP)

( * ) Notice: Subject to any disclaimer, the term of this patent is extended or adjusted under 35 U.S.C. 154(b) by 183 days.

(21) Appl. No.: 10/370,369

(22) Filed: Feb. 18, 2003

(65) Prior Publication Data
US 2003/0219658 A1 Nov. 27, 2003

(30) Foreign Application Priority Data
Feb. 18, 2002 (JP) ........................................ 2002-039444

(51) Int. Cl.[7] .............................. G03F 9/00; G03C 5/00
(52) U.S. Cl. ........................ 430/30; 430/296; 430/942; 382/148; 382/149
(58) Field of Search .......................... 430/30, 296, 942; 382/145, 148, 159, 151

(56) References Cited

U.S. PATENT DOCUMENTS 6,248,486 B1 * 6/2001 Dirksen et al. ............... 430/30
6,268,093 B1 * 7/2001 Kenan et al. .................. 430/30
6,368,763 B2 * 4/2002 Dirksen et al. ............... 430/30

FOREIGN PATENT DOCUMENTS

JP    11-288879 A    10/1999

OTHER PUBLICATIONS

*Electron Beam Testing Handbook*, Japan Society for Promotion of Science, 98th research material of 132th Committee on Application of Charge Particle Beam to Industry, pp. 255, figure 8.3 (1987).

* cited by examiner

Primary Examiner—Christopher G. Young
(74) Attorney, Agent, or Firm—Townsend and Townsend and Crew LLP

(57) ABSTRACT

Size characteristic quantities are measured at a plural locations. The size characteristic quantities include edge widths, pattern widths, and/or pattern lengths of the electron-beam images of a resist-dropout pattern and a resist-remaining pattern that are located such that the effective exposure quantities differ depending on the places. With the predetermined measurement errors added thereto, the size characteristic quantities are compared with model data that has been created in advance and that causes various exposure conditions to be related with the size characteristic quantities measured under these various exposure conditions. This comparison makes it possible not only to estimate deviation quantities in the exposure quantity and the focal-point position from the correct values, but also to calculate ambiguity degrees of the estimated values. This allows the implementation of a proper monitoring/controlling of the exposure-condition variations (i.e., the deviations in the exposure quantity and the focal-point position) in the lithography process.

18 Claims, 30 Drawing Sheets

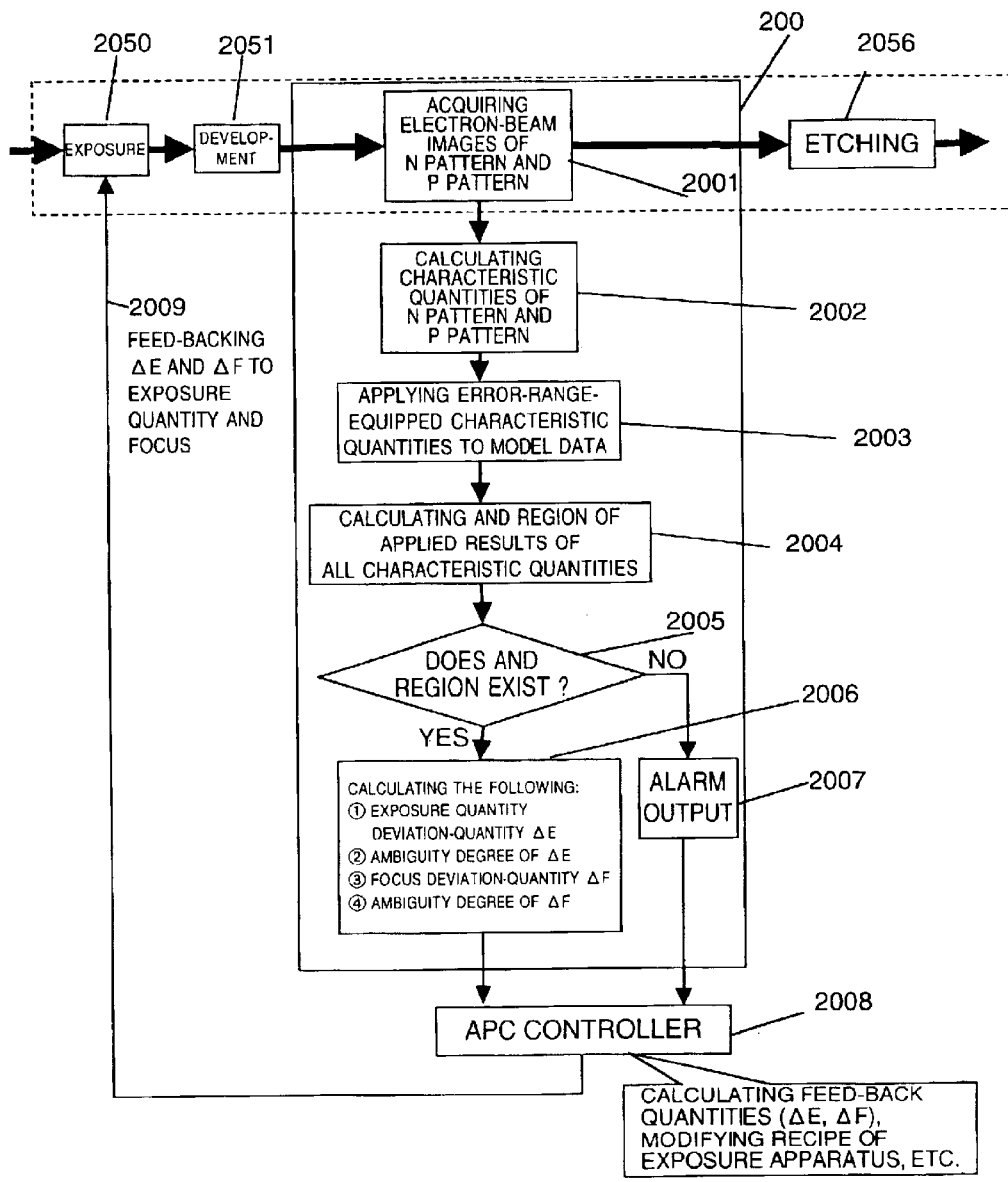

N PATTERN — RESIST — d

−DEVIATION ← BEST FOCUS → +DEVIATION 401a  401b  401c  401d  401e  401f

EDGE WIDTH

403 N PATTERN

FOCUS

− BEST FOCUS +

P PATTERN — RESIST

← −DEVIATION     BEST FOCUS     +DEVIATION →

402a   402b   402c   402d   402e   402f

EDGE WIDTH

404 P PATTERN

FOCUS

−   BEST FOCUS   +

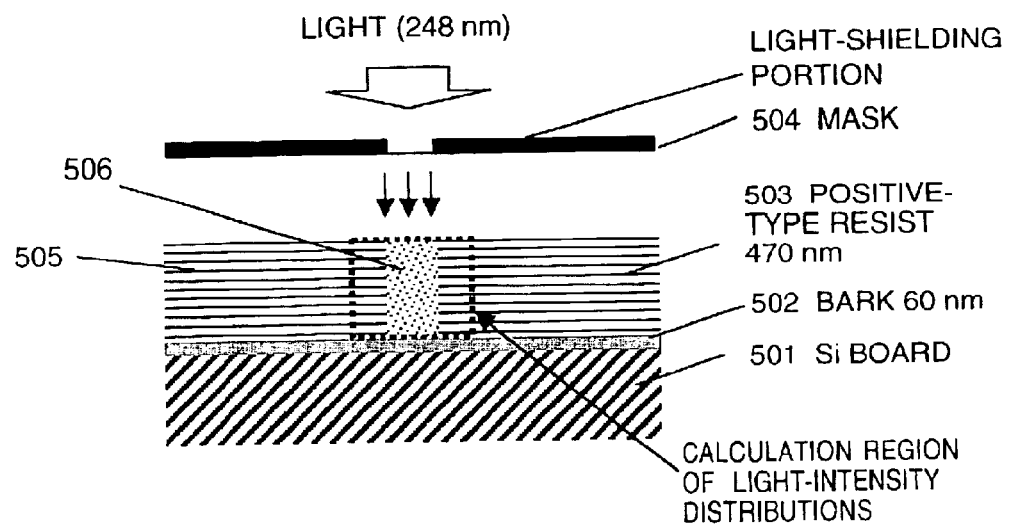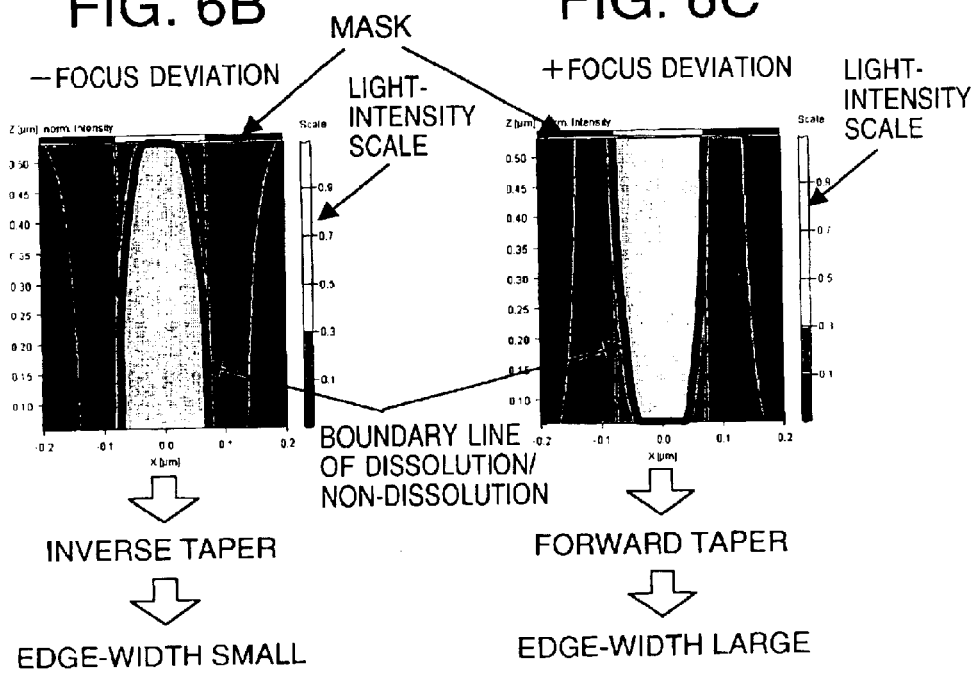

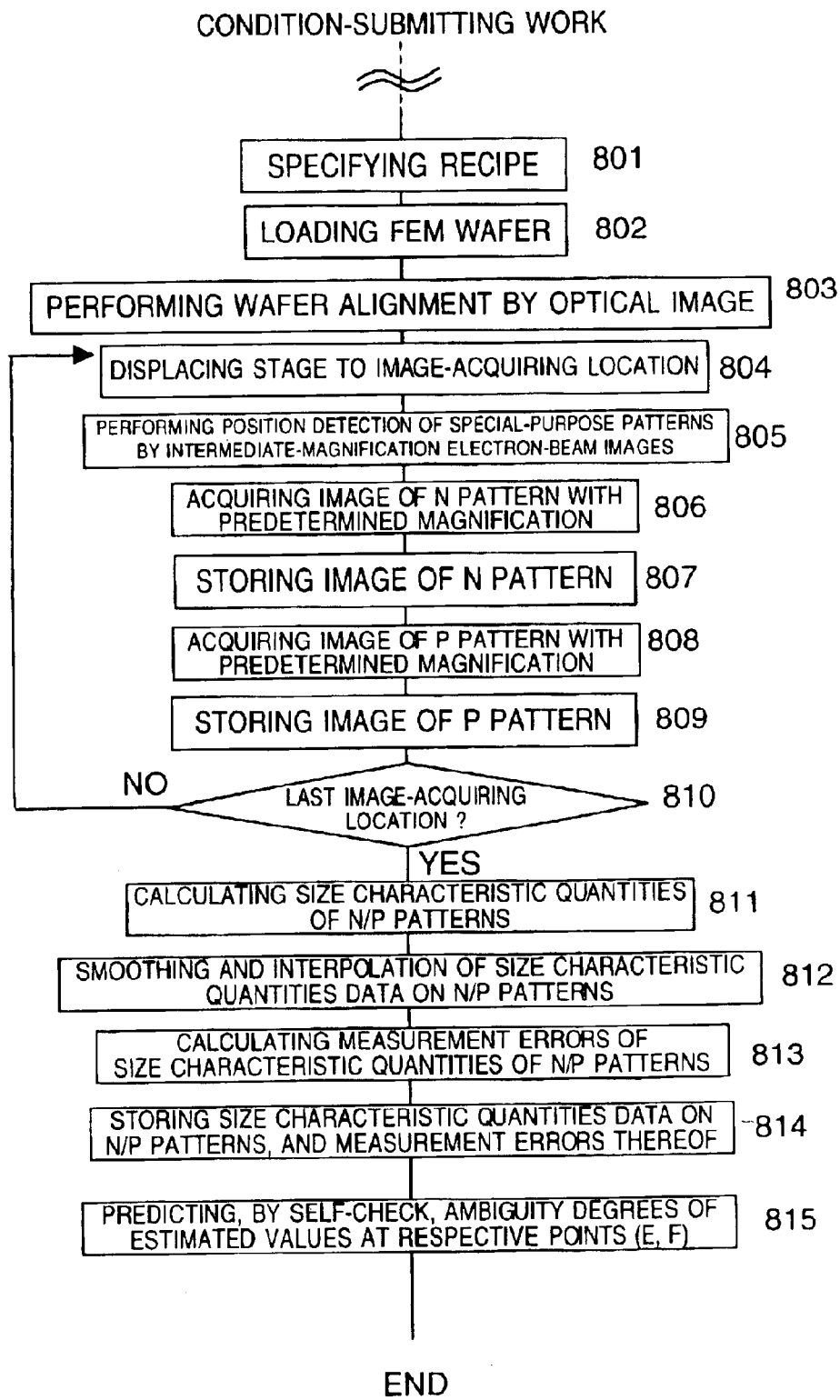

FIG. 13A
RECIPE FOR MODEL-DATA CREATION

| 1 | DATA ON SIZE OF WAFER, AND MAGNITUDE AND ARRANGEMENT OF SHOTS |
|---|---|
| 2 | DATA ON WAFER ALIGNMENT (ALIGNMENT POSITION, TEMPLATE IMAGE FOR ALIGNMENT, etc) |
| 3 | DATA ON PATTERN ALIGNMENT (IN-SHOT COORDINATE, TEMPLATE IMAGE FOR PATTERN ALIGNMENT, etc) |
| 4 | DATA ON ELECTRON-BEAM IMAGE ACQUISITION (INFORMATION ON IN-SHOT COORDINATE OF ELECTRON-BEAM IMAGE ACQUIRING LOCATION, AND CHARACTERISTIC-QUANTITY CALCULATING METHOD) |
| 5 | INFORMATION ON EXPOSURE QUANTITY AND FOCUS (EXPOSURE QUANTITY AND FOCUS VALUE OF EACH SHOT ON FEM WAFER) |

FIG. 13B
INFORMATION ON CHARACTERISTIC-QUANTITY CALCULATING METHOD

| 1 | DIFFERENTIATION BETWEEN SPECIAL-PURPOSE PATTERN/NON-SPECIAL-PURPOSE PATTERN |
|---|---|
| 2 | TYPE OF SPECIAL-PURPOSE PATTERN |
| 3 | LENGTH-MEASURING LOCATION OF NON-SPECIAL-PURPOSE PATTERN AND SPECIFICATION OF LENGTH-MEASURING METHOD |

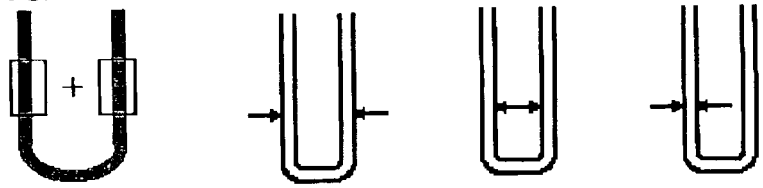

FIG. 13C    FIG. 13D    FIG. 13E    FIG. 13F

FIG. 14
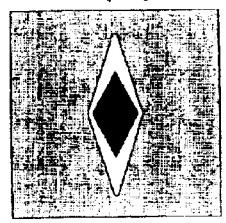
(a)
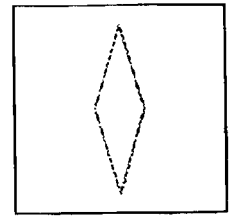
(b)
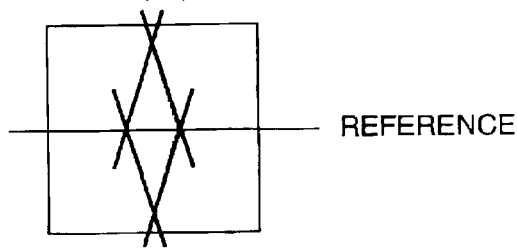
(c) REFERENCE
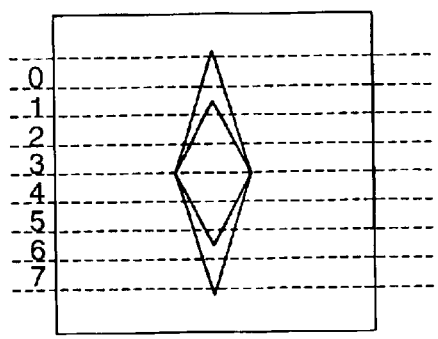
(d)
(e)
| No. | LINE WIDTH | EDGE WIDTH |
|---|---|---|
| 0 | LW(0) | EW(0) |
| 1 | LW(1) | EW(1) |
| 2 | LW(2) | EW(2) |
| 3 | LW(3) | EW(3) |
| 4 | LW(4) | EW(4) |
| 5 | LW(5) | EW(5) |
| 6 | LW(6) | EW(6) |
| 7 | LW(7) | EW(7) |

SMOOTHING

INTERPOLATION

FIG. 17A
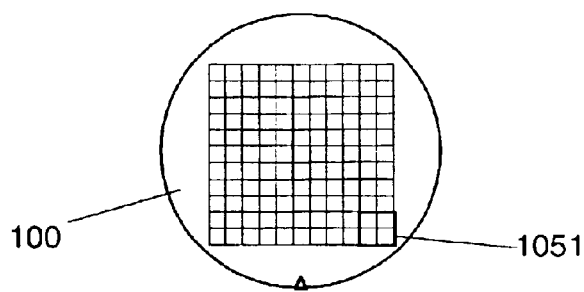
FIG. 17B
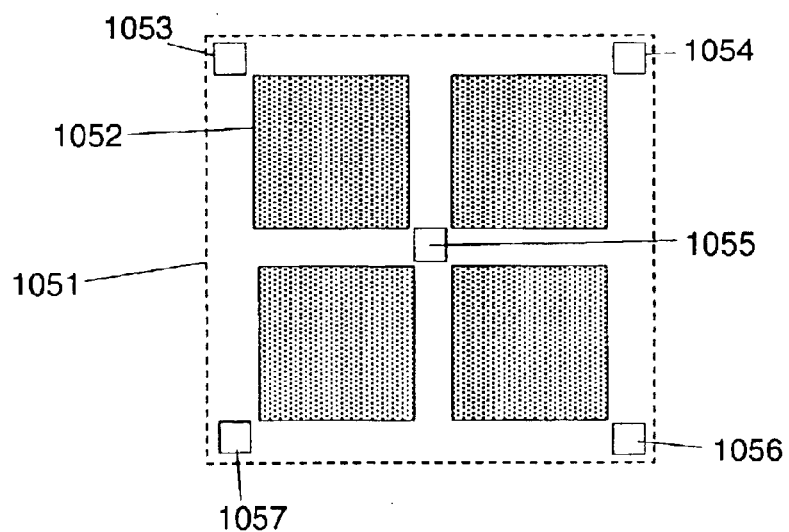
FIG. 17C
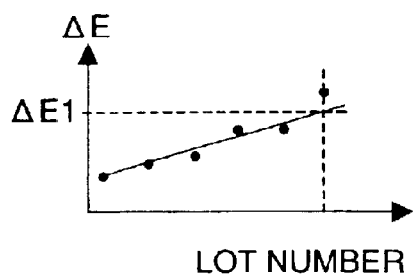
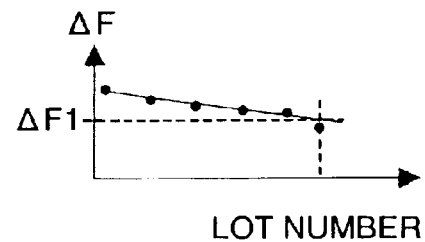

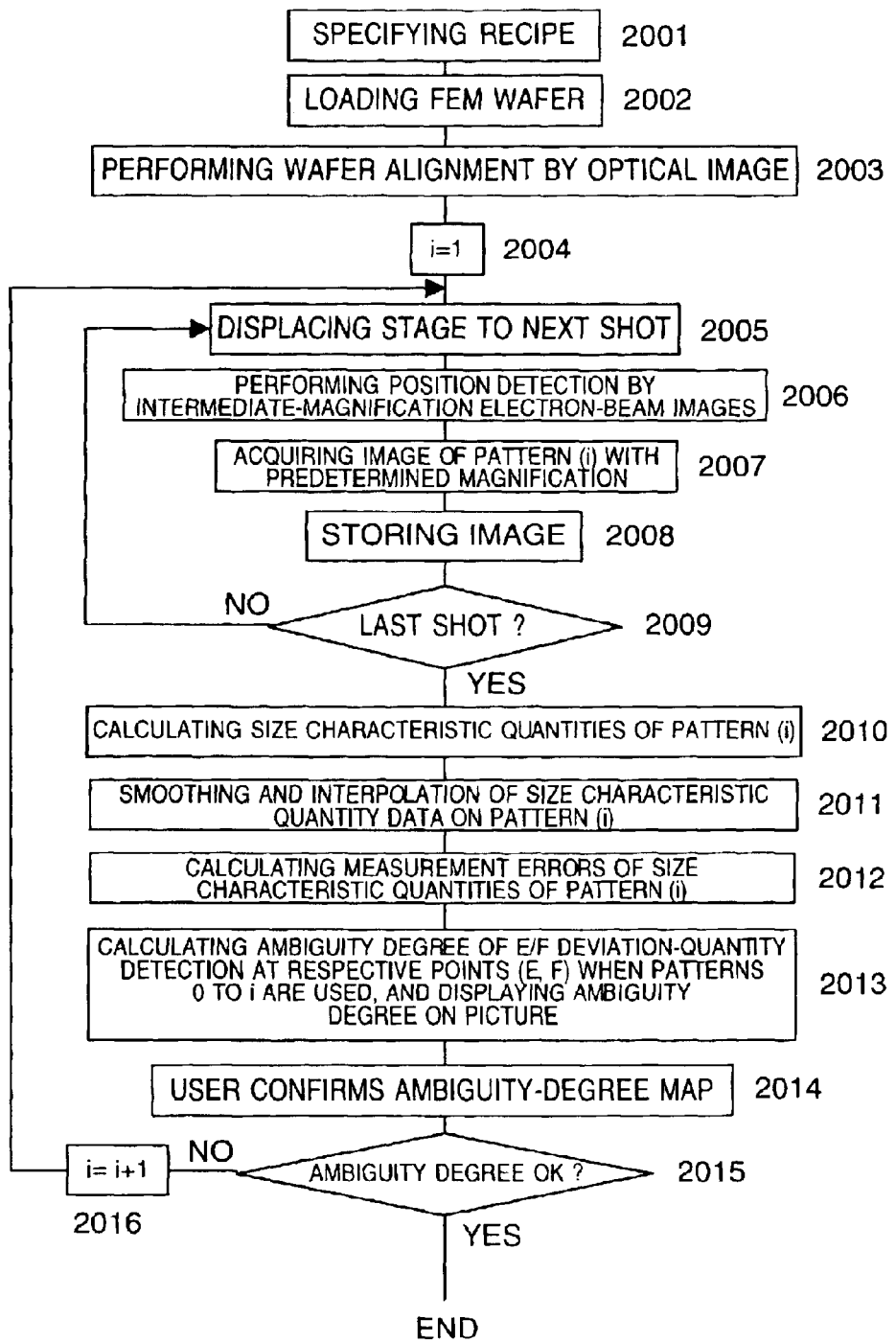

DEFINING LIMIT-SIZE PATTERN — 2501

⇩

LITHOGRAPHY SIMULATOR — 2502

⇩

SPECIFICATION OF PATTERN FOR EXPOSURE-CONDITION MONITORING — 2503

⇩

MASK DESIGN ——— 2504

⇩

$W_1$ : BOTTOM WIDTH OF RESIST PATTERN
Θ : INCLINATION ANGLE OF RESIST PATTERN
$W_2$ : WIDTH OF FILM PATTERN

CROSS SECTION OF MEASUREMENT TARGET

SECONDARY-ELECTRON SIGNAL WAVEFORM

LINE WIDTH

METHOD OF OBSERVING EXPOSURE CONDITION FOR EXPOSING SEMICONDUCTOR DEVICE AND ITS APPARATUS AND METHOD OF MANUFACTURING SEMICONDUCTOR DEVICE

BACKGROUND OF THE INVENTION

1. Field of the Invention

The present invention relates to a method of monitoring, using the electron-beam image of a resist pattern, whether or not the exposure has been performed under an appropriate exposure condition at the time of forming the resist pattern on a semiconductor board at the lithography step in the manufacture of a semiconductor device. Also, it relates to a method of manufacturing the semiconductor device. In particular, it relates to a technology for controlling the exposure process so as to maintain the correct exposure condition, and a method of manufacturing the semiconductor device by using this condition.

2. Description of the Related Art

FIG. 27 illustrates a flow of the conventional lithography step.

At first, a resist, i.e., a photosensitive material, is coated on a board such as a semiconductor wafer with a predetermined thickness. Then, the downsize exposure of a mask pattern to the resist is performed, using an exposure apparatus (step 2050). After that, the downsize-exposed resist is developed (step 2051), thereby forming a resist pattern. Next, the size checking of the formed resist pattern is carried out, using a scanning electron microscope equipped with a size-measuring function (i.e., length-measuring SEM) (step 2052). The conventional processing contents performed using the length-measuring SEM are as follows, for example: After acquiring the electron-beam image of the region including a portion whose size-accuracy is to be strictly managed (step 2053), the resist-pattern size is measured (step 2054). Next, a judgement is made as to whether or not the size will satisfy a criterion (step 2055). If the size does not satisfy the criterion, the exposure quantity provided by the exposure apparatus is modified (step 2056, the correction quantity to the exposure quantity is represented by ΔE). In the case of, e.g., a positive-type resist, the exposure quantity is increased if the resist-pattern size is too large, while the exposure quantity is decreased if the resist-pattern width is too small. Also, in many cases, the increased or decreased quantity of the exposure quantity has been determined based on the experience and the intuition of a worker in charge.

FIG. 28 illustrates the relationship between the resist pattern and a film pattern after being etched (cited from "Electron Beam Testing Handbook", p. 255, Japan Society for the Promotion of Science, 98th research material of 132nd Committee on Application of Charged Particle Beam to Industry). If the etching conditions are identical, there exists a certain fixed relationship between the configuration of the resist pattern and that of the after-etched film pattern. Accordingly, in order to obtain the film pattern having a predetermined configuration, the resist pattern is also required to have the predetermined configuration. Also, when starting to manufacture a new product-type of semiconductor device or the like, prior to the introduction of a product wafer, there is performed "a condition-submitting work" for finding out a focal-point position and an exposure quantity that make it possible to acquire a predetermined resist-pattern configuration. This finding-out is carried out as follows: At first, a wafer illustrated in FIG. 12A is formed on which a pattern is pasted by being baked under a condition that the focal-point position and the exposure quantity are changed on each shot (i.e., onetime exposure unit) basis (the wafer of this kind is commonly referred to as "FEM (: Focus & Exposure Matrix) sample"). Next, in addition to the execution of the size measurement of the resist pattern on each shot basis, the wafer is cut off so as to inspect its cross-section configuration or the like. Incidentally, JP-A-11-288879 has disclosed a system for supporting the condition-submitting work. This work determines an exposure quantity (E0) and a focal-point position (F0) that allow variation margins to be taken more widely in the exposure quantity and the focal-point position. Then, based on these conditions, the exposure to the product wafer is carried out. There exist, however, some cases where a probability is increased that the resist pattern having the specification-satisfying configuration cannot be acquired. This is because various process variations (e.g., a change in the photosensitivity of the resist, a film-thickness variation in an anti-reflection film under the resist, and drifts in the respective types of sensors of the exposure apparatus) decrease the variation margins under the conditions (E0, F0) determined in the condition-submitting work. Detecting these process variations is a role to be played by the above-described size measurement (i.e., the step 2). In the prior arts, the attempt has been made to compensate, by the correction to the exposure quantity, for the size change in the resist-pattern configuration caused by the process variations.

In the prior arts, in order to detect and take a countermeasure against the process variations, the following method has been employed: The size value of a line width or the like is inspected, using the length-measuring SEM. Then, if the size value does not satisfy a criterion, the exposure quantity is corrected. This method, however, is accompanied by the following 1st to 3rd problems:

As the first problem, the length-measuring SEM usually observes, from directly above, the resist-pattern configuration formed on the semiconductor board. Also, the length-measuring SEM measures the size value of the edge configuration of the resist pattern that has appeared on the electron-beam image acquired in this state. There exists, however, a variation in the resist-pattern configuration which cannot be measured by conventional measuring techniques. Concretely, this variation means a variation in the resist-pattern's edge configuration caused by the variation in the focal-point position at the time of the exposure. The conventional measuring techniques find it impossible to detect this variation. The cross-section configuration of the resist pattern formed on the semiconductor board is a substantially trapezoidal configuration. Concerning the signal intensity of secondary electrons detected by the scanning electron microscope as a signal generated from the sample, the signal intensity from the inclined portion is stronger than the one from the flat portion. As a result, as illustrated in FIG. 29A, the signal waveform becomes a one that has the peaks at the locations corresponding to the edges of the trapezoid. In the size measurement by the length-measuring SEM, as illustrated in, e.g., FIG. 29B, the following method or the like is employed: Straight lines are applied to the outer-side portions and the base portions of the peaks so as to determine each intersection point of the respective 2 straight lines, then defining, as the line width, the distance between the right and left intersection points. FIG. 30 is a graph for indicating how the line width will change if the exposure quantity and the focal-point position are changed, where the focal-point position is set up in the transverse-axis and the line width is plotted on each exposure-quantity basis (i.e., e 0 to e 8). The exposure quantity lies in the range of e 0<e 1< . . . <e 8. Moreover, there exists a relationship that the line width becomes smaller as the exposure quantity grows larger (, which is in the case of a positive-type resist. This relationship becomes opposite in the case of a negative-type).

Consequently, inspecting the line width makes it possible to detect the variation in the exposure quantity. As is apparent from the same graph, however, the line width does not change greatly with respect to the change in the focal-point position. In particular, in proximity to the correct exposure quantity (i.e., e 4), the line width scarcely changes if the focal-point position is changed. Accordingly, the inspection of the line width does not make it possible to detect the variation in the focal-point position. Meanwhile, even if the line width does not change, the cross-section configuration of the resist pattern changes if the focal-point position is changed as is illustrated in FIG. 30B. As described earlier, the change in the cross-section configuration of the resist pattern exerts the influence on the film pattern after being etched. As a consequence, the use of the conventional measuring techniques, which are incapable of detecting the variation in the focal-point position, may result in even a danger of producing a configuration failure of the after-etched film pattern in large quantities.

As the second problem, there exists a problem that the correction of the exposure quantity alone, naturally, finds it impossible to deal with the case where the focal-point position has been deviated. In the case of, e.g., the situation A in FIG. 30A, since the line width is larger than the normal line width, the processing of increasing the exposure quantity will be carried out based on the measurement result of the line width. This processing, however, makes no correction to the deviation in the focal-point position, thereby simply bringing about the situation B in FIG. 30A and never implementing the normal cross-section configuration of the resist pattern. This, accordingly, may again result in even the danger of producing the configuration failure of the after-etched film pattern in large quantities.

As the third problem, in the above-described prior arts, there also exists a problem of being unable to acquire information for indicating the process variations in a quantitative manner. Here, this information is needed in order to maintain the normal exposure process. In accompaniment with the microminiaturization of a semiconductor pattern in recent years, the variation allowable range of the exposure quantity and that of the focal-point position have become exceedingly small. For example, it is requested that, when the pattern rule is smaller than 180 nm, the variation range of the exposure quantity is controlled to become smaller than ±10% of the size value, and that of the focal-point position is controlled to become smaller than ±0.2 to 0.3 $\mu$m. The implementation of these variation allowable ranges requires the information for indicating the process variations in a quantitative manner, i.e., an accurate quantification of the variation quantities. This accurate quantification is such that the deviation in the exposure quantity is equal to such-and-such mJ, and the deviation in the focal-point position is equal to such-and-such $\mu$m. In the prior arts, the detection of the deviation in the focal-point position is not performed at all. Moreover, it cannot help saying that the detection of the deviation in the exposure quantity is inaccurate. The reason for this is as follows: Despite the fact that, in general, the variation in the focal-point position also changes the line width, the size variation quantity caused by the variation in the focal-point position has also been compensated for by the adjustment of the exposure quantity. Consequently, the use of the prior arts finds it impossible to maintain the normal exposure process.

SUMMARY OF THE INVENTION

The present invention provides a method and a unit of making it possible to monitor a variation in an exposure condition, and a method of manufacturing a semiconductor device by using this method and unit. In particular, the present invention provides an exposure-condition monitoring method and a semiconductor-device manufacturing method that make it possible to detect a variation in the focal-point position as well as a variation in the exposure quantity. Simultaneously in addition to the above-described detection, the exposure-condition monitoring method and the semiconductor-device manufacturing method also make it possible to output the information for indicating the process variations in a quantitative manner, i.e., the accurate variation quantity in the exposure quantity and the one in the focal-point position.

Namely, in the present invention, in the method of monitoring the exposure condition, the following processings are performed: At first, there is formed a resist pattern having a configuration which is formed by being exposed under a predetermined exposure condition and on which the effective exposure quantities differ depending on the places. Next, the resist pattern is photographed using a scanning electron microscope, thereby acquiring the electron-beam image of the resist pattern. Moreover, using this electron-beam image, characteristic sizes of the resist pattern are measured at a plurality of locations at which the effective exposure quantities differ from each other. Furthermore, using the following information, the estimates are made concerning a deviation quantity in the exposure quantity from a correct value and a deviation quantity in the focal-point position from a correct value under the predetermined exposure condition: Information on in-advance created model data that relates various types of exposure conditions with the characteristic sizes of the resist pattern formed under these exposure conditions, and the information on the characteristic sizes measured at the plurality of locations at which the effective exposure quantities differ from each other.

Also, in the present invention, in order to accomplish the above-described objects, in the method of manufacturing the semiconductor device, the following processings are performed: At first, using an exposure apparatus, a resist coated on a board is exposed under the exposure condition of a predetermined exposure quantity and a predetermined focal-point position. Then, this exposed resist is developed, thereby forming a resist pattern on the board. Next, the board on which this resist pattern is formed is photographed using a scanning electron microscope, thereby acquiring the electron-beam image of the resist pattern. Moreover, this electron-beam image is processed, thereby extracting characteristic sizes of the resist pattern. Furthermore, the estimate quantities of deviations from correct values in the predetermined exposure quantity and the predetermined focal-point position of the exposure apparatus, and the ambiguity degrees of these estimate quantities are determined from the following information: Information on in-advance created model data that relates various types of exposure conditions with the characteristic sizes of the resist pattern formed under these exposure conditions, and the information on the extracted characteristic sizes of the resist pattern. In addition, the correction quantities to the exposure quantity and the focal-point position of the exposure apparatus are determined based on the information on these determined estimate quantities of the deviations and the determined ambiguity degrees of these estimate quantities. Finally, the exposure quantity and the focal-point position of the exposure apparatus are corrected based on these determined correction quantities.

Other objects, features and advantages of the invention will become apparent from the following description of the embodiments of the invention taken in conjunction with the accompanying drawings.

BRIEF DESCRIPTION OF THE DRAWINGS

FIG. 2 is a diagram for illustrating a lithography step having the process-variations monitoring system related to the first embodiment;

FIGS. 6A, 6B, and 6C are diagrams for illustrating the principle of the relationship between the deviation in the focal-point position and the change in the cross-section configuration in the N pattern;

FIG. 11 is a diagram for illustrating a flow for the model-data creation related to the first embodiment;

FIGS. 13A, 13B, 13C, 13D, 13E, and 13F are diagrams for illustrating the contents of a recipe for the model-data creation;

FIG. 14 is a diagram for illustrating one example of the method of calculating size characteristic quantities related to the first embodiment;

FIGS. 17A, 17B, and 17C are diagrams for illustrating one example of the method of locating special-purpose patterns on the wafer;

FIG. 21 is a diagram for illustrating another flow for the model-data creation related to the second embodiment;

DESCRIPTION OF THE EMBODIMENTS

Figure 1A:
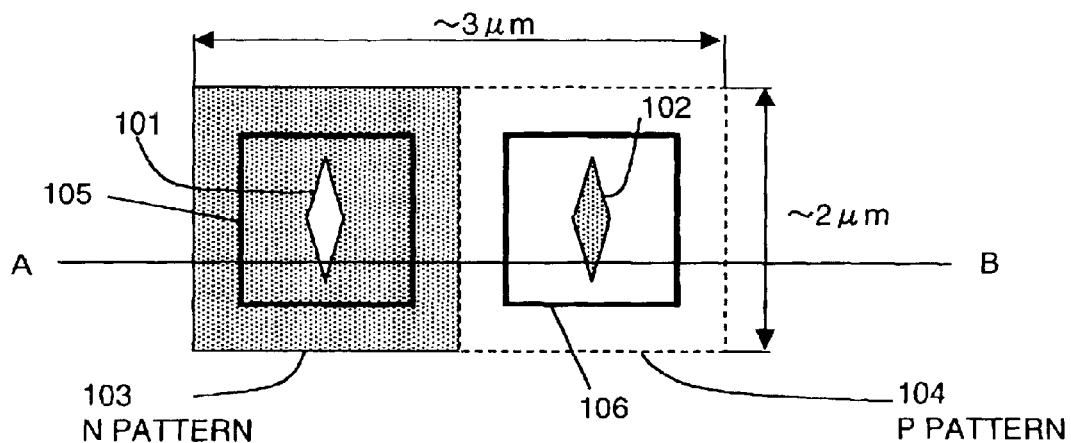
FIGS. 1A, 1B, and 1C are diagrams for illustrating one example of a pattern suitable for the exposure-condition variation monitoring related to the first embodiment.

Hereinafter, referring to the drawings, the explanation will be given below concerning the embodiments of the present invention. Incidentally, although the present invention is applicable to both the positive-type resist and the negative-type resist, the explanation will be given assuming the positive-type resist.

(1) Entire Flow of the First Embodiment

FIG. 2 is a conceptual diagram for illustrating a lithography step having the exposure-condition monitoring method related to the first embodiment of the present invention. In the diagram, the portion surrounded by the dashed line indicates the flow (, which proceeds from left to right) of a product wafer. Also, the portion 2000 surrounded by the solid line indicates the flow (, which proceeds from above to below) of the processings for the exposure-condition monitoring constructed on a length-measuring SEM.

In the first embodiment, the monitoring of the exposure condition is performed using the electron-beam images of special-purpose resist patterns for the exposure-condition monitoring illustrated in FIG. 1. In FIG. 1A, the resist dropouts in a rhombus in a left-side pattern 103, and the resist remains in a rhombus in a right-side pattern 104. Hereinafter, the resist-dropout pattern and the resist-remaining pattern are referred to as "an N pattern" and "a P pattern", respectively. At a step 2001 in FIG. 2, there are acquired the electron-beam images of a region including the P pattern and the N pattern. Next, at a step 2002 in FIG. 2, size characteristic quantities are calculated which quantify a configuration change in the P pattern and a one in the N pattern caused by exposure-condition variations (i.e., a deviation in the focal-point position and a deviation in the exposure quantity).

Figure 1B:
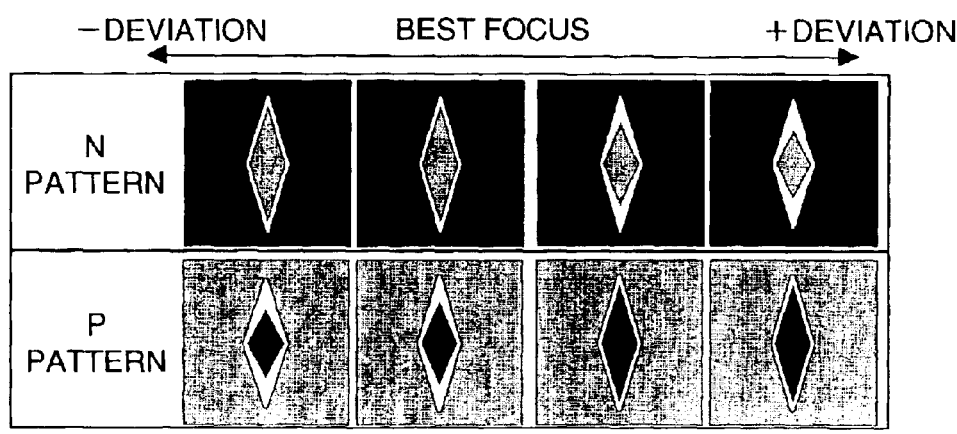

FIG. 1B illustrates the changes in the electron-beam images of the N pattern and the P pattern due to the focal-point position variation. On the secondary-electron images acquired by the length-measuring SEM, the flat portions are detected dark and the inclined portions are detected bright. Accordingly, in the diagram, the side-wall portions (including the edge portions) of the patterns are displayed in white, and the flat portions are displayed in gray.

As illustrated in FIG. 1B, in the N pattern, if the focal-point position is deviated in the plus-direction (i.e., if the focal-point position is deviated on the upper-side with respect to the resist surface), the edge width is broadened. If, however, the focal-point position is deviated in the minus-direction, the pattern change is small. Meanwhile, in the P pattern, if its inverse focal-point position is deviated in the minus-direction (i.e., if the focal-point position is deviated on the lower-side with respect to the resist surface), the edge width is broadened. If, however, the focal-point position is deviated in the plus-direction, the change in the edge width is small. In order to detect the focal-point position variation with accuracies that are basically the same with respect to the plus/minus signs, both the edge width of the N pattern and that of the P pattern are simultaneously detected as the size characteristic quantities. Incidentally, regarding the plus/minus signs of the focal-point position variation in the present invention, the state where the focal-point plane is deviated on the upper-side with respect to the resist pattern is treated as the plus sign, and the state where the focal-point plane is deviated on the lower-side is treated as the minus sign.

Figure 1C:
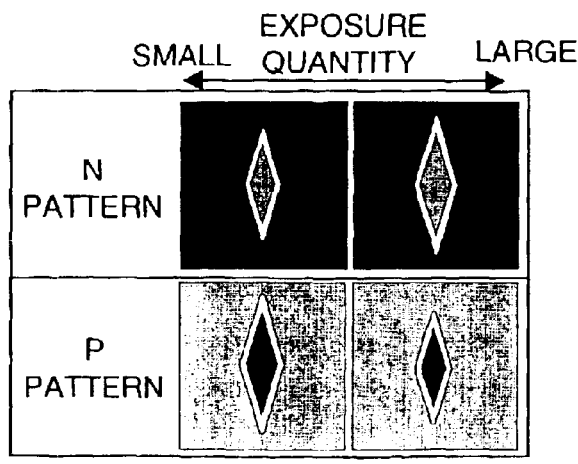

Also, FIG. 1C illustrates the changes in the electron-beam images of the N pattern and the P pattern due to the exposure quantity variation. In the N pattern, if the exposure quantity is increased, the pattern size becomes larger. In the P pattern, if the exposure quantity is increased, the pattern size becomes smaller. In order to detect the exposure quantity variation, the line width of the N pattern and that of the P-pattern are calculated. Incidentally, unlike the detection of the focal-point position deviation, both the pattern width of the N pattern and that of the P pattern are not necessarily required. Accordingly, it is also allowable to calculate one of the line widths.

Now, going back to FIG. 2, the explanation will be given subsequently regarding the entire flow. The calculated size characteristic quantities are applied to in-advance created model data for indicating the relationship between the exposure quantities/the focal-point positions and the respective size characteristic quantities. This makes it possible to determine the deviation ($\Delta e$) in the exposure quantity and the deviation ($\Delta f$) in the focal-point position. An example of this model data is a lookup table describing the values of the size characteristic quantities at the various exposure quantities and the various focal-point positions. Also, "ambiguity degrees" of the estimated $\Delta e$ and $\Delta f$ can be determined at the same time (steps 2003 to 2006; the details will be described later).

These results are sent to a semiconductor-manufacture control system such as an APC controller 2008 that performs the process control. Then, based on time progressions of the exposure quantity variation and the focal-point position variation, the above-described ambiguity degrees, and the like, feed-back quantities $\Delta E$ and $\Delta F$ to the exposure apparatus are determined. Furthermore, the recipe of the exposure apparatus is modified based on $\Delta E$ and $\Delta F$. As a consequence, it turns out that the exposure to the wafer (lot) hereinafter is performed under a better process condition. Additionally, the model data has been created assuming the deviation in the exposure quantity and the one in the focal-point position existing in a certain fixed range. Consequently, if the deviations fall out of this range, there exists none of the exposure quantity and the focal-point position that are applicable to the model (step 2005 "No" branch). In this case, an alarm is issued (step 2007).

In the present invention, even the slightest degree of deviations of the focal-point position and the exposure quantity from the optimum values (even if the deviations are variations within the process window) can be detected, then being feed-backed to the exposure condition. This makes it possible to maintain the normal exposure process.

The most outstanding feature of the present invention lies in the point of accurately calculating even the slightest focal-point position deviation and even the slightest exposure quantity deviation. Hereinafter, the explanation will be given below concerning the details of the present invention.

(2) Configuration of Length-Measuring SEM Used in the First Embodiment

Figure 3:
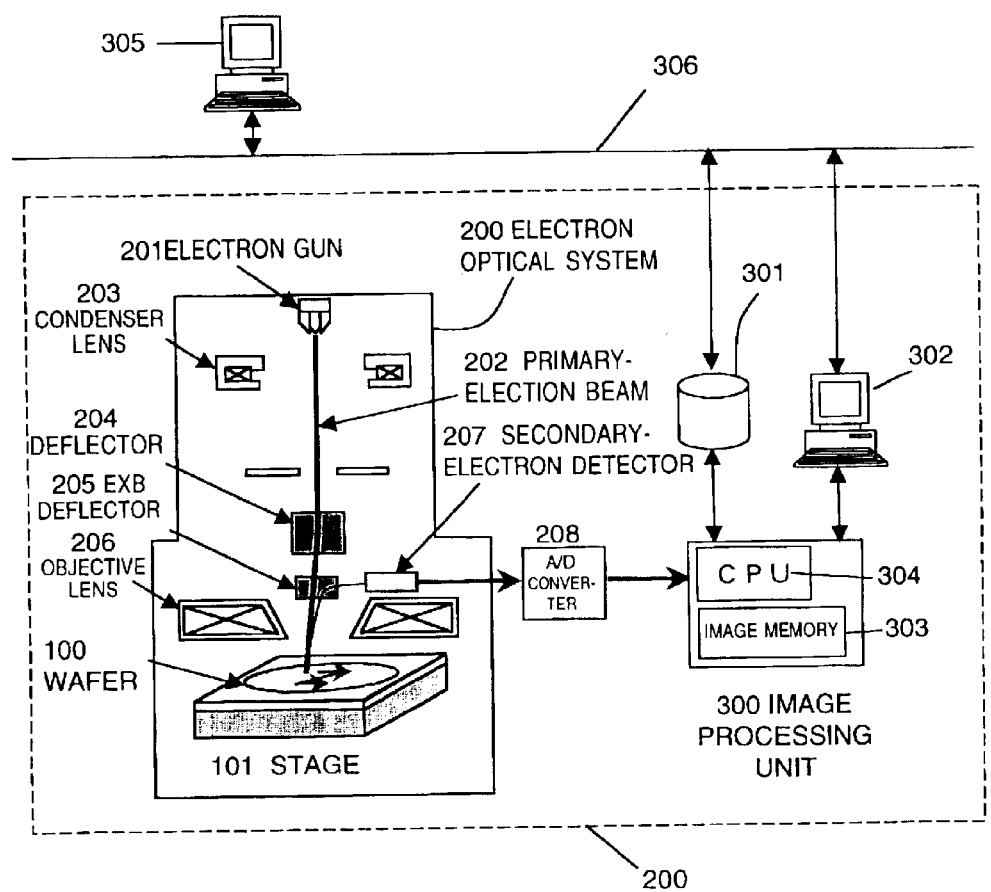
FIG. 3 is an entire configuration diagram of the length-measuring SEM related to the first embodiment.

The explanation will be given below regarding the length-measuring SEM used for the exposure-condition variation monitoring related to the present invention. FIG. 3 is a block diagram for illustrating the configuration of the length-measuring SEM. The portion surrounded by the dashed line 200 indicates configuration components of an exposure-condition monitoring system constructed on the length-measuring SEM. In FIG. 3, a primary-election beam 202 emitted from an electron gun 201 passes through a beam deflector 204, an ExB deflector 205, and an objective lens 206. Then, the surface of a wafer 100 (including a liquid crystal board) placed on a stage 101 is irradiated with the primary-election beam in a state where the focus has been achieved.

When the irradiation with the primary-election beam has been performed, secondary electrons are generated from the sample, i.e., the wafer 100. The secondary electrons generated from the wafer 100 are deflected by the ExB deflector 205, then being detected by a secondary-electron detector 207. The secondary electrons are generated from the sample in synchronization with a 2-dimensional scanning by the election beam by the deflector 204, or an X-directional repetition scanning by the election beam by the deflector 204, and a Y-directional continuous displacement of the wafer by the stage 101. These secondary electrons are detected, thereby allowing the acquisition of the 2-dimensional electron-beam image.

The signals detected by the secondary-electron detector 207 are converted into digital signals by an A/D converter 208, then being sent to an image processing unit 300. The image processing unit 300 includes an image-memory storage medium 303 for temporarily storing the digital images, and a CPU 304 for calculating the size characteristic quantities from the images on the image memory. Also, there is further provided a storage medium 301 for describing the in-advance inspected model that relates the exposure conditions with the size characteristic quantities.

A workstation 303 performs the control over the entire apparatuses. The operations of necessary apparatuses, the confirmation of the detection result, and the like can be implemented using a graphical user interface (hereinafter, noted as "a GUI"). Also, the storage medium 301 and the workstation 302 are connected to an external network 306, and accordingly have a configuration that allows the data exchanges with the outside. Also, an external display apparatus 305 existing on the network displays the situation (e.g., present state of the exposure apparatus, recipe history of the exposure apparatus, and process control scheme) of the process control performed by the not-illustrated APC controller.

(3) Explanation on Behaviors of Special-Purpose Patterns Used in the First Embodiment Next, the explanation will be given below concerning the special-purpose patterns used for the exposure-condition variation monitoring related to the present invention. In the present invention, a combination of the N pattern/the P pattern whose configuration or location has been devised is used so that the effective exposure quantities will differ depending on the places. At first, the explanation will be given regarding the cause for a difference in the behavior between the N pattern/the P pattern. Next, the explanation will be given regarding an aim with which there is used a configuration or a location on which the effective exposure quantities differ depending on the places.

(i) Cause for Difference in Behavior Between N/P

Figure 4A:
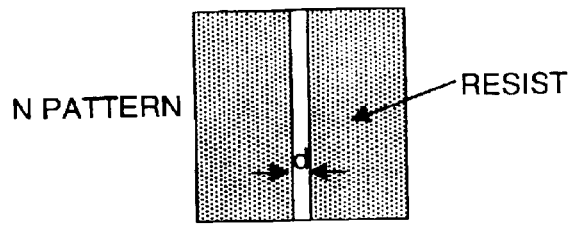
FIGS. 4A, 4B, and 4C are diagrams for illustrating the relationship between a deviation in the focal-point position and a change in the cross-section configuration in an N pattern.
Figure 4B:
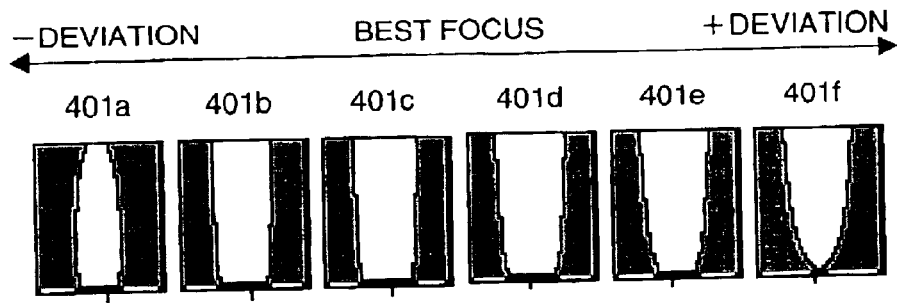
Figure 5A:
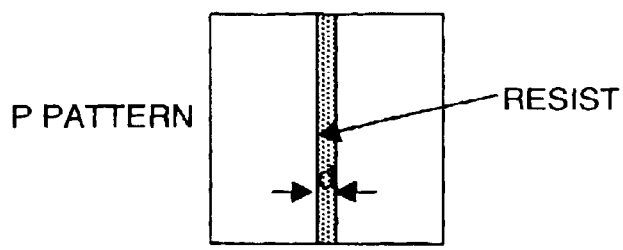
FIGS. 5A, 5B, and 5C are diagrams for illustrating the relationship between a deviation in the focal-point position and a change in the cross-section configuration in a P pattern.
Figure 5B:
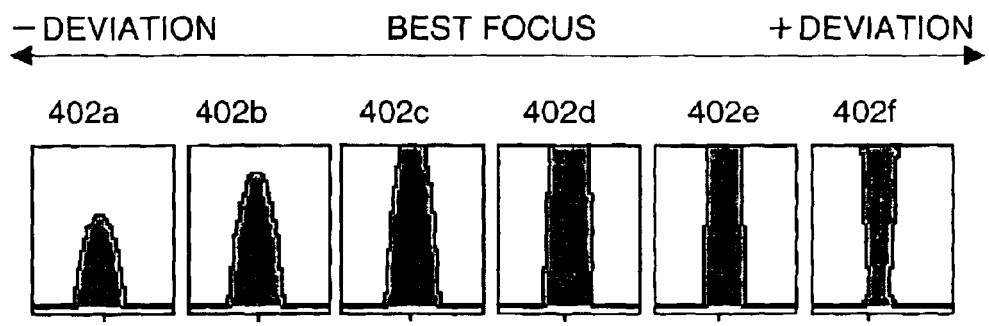
Figure 5C:
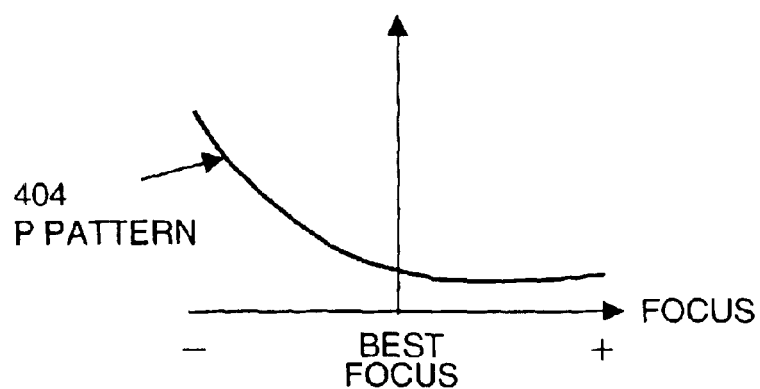

FIG. 4B illustrates how the cross-section configuration of an isolated-line-shaped dropout pattern (FIG. 4A), which can also be said to be the simplest N pattern, will be changed by the focal-point position deviation at the time of the exposure. Also, FIGS. 5A, 5B, and 5C illustrate how the cross-section configuration of an isolated-line-shaped remaining pattern (FIG. 5A), which can also be said to be the simplest P pattern, will be changed by the focal-point position deviation at the time of the exposure. Hereinafter, the case where the focal-point position is deviated in an upward-direction with respect to the resist surface and the case where the focal-point position is deviated in a downward-direction with respect thereto will be referred to as "+focal-point position deviation" and "−focal-point position deviation", respectively.

In the case of the N pattern, in the −focal-point position deviation, the upper portion of the resist overhangs more than the lower portion thereof does. In contrast to this, in the +focal-point position deviation, the lower portion of the resist overhangs more than the upper portion thereof does. For simplicity, the former and the latter will be referred to as "inverse taper" and "forward taper", respectively. In the N pattern, the inverse taper appears in the −focal-point position deviation, and the forward taper appears in the +focal-point position deviation. Meanwhile, in the P pattern, the forward taper appears in the −focal-point position deviation, and the inverse taper appears in the +focal-point position deviation.

In the case of the pattern-configuration observation using the length-measuring SEM, the observation is usually performed from directly above the sample (i.e., top down view: image detection from vertically above). In this case, the large-or-small of the taper angle in the forward taper appears as a difference in the width between the taper-equivalent portions. On the other hand, the large-or-small of the taper angle in the inverse taper does not appear on the image. Consequently, the N pattern and the P pattern turn out to have the following tendencies ① and ② on the respective electron-beam images.

① N pattern: The edge width is broadened if the focal-point position is deviated in the +direction, whereas the change in the electron-beam image is small if the focal-point position is deviated in the −direction.

② P pattern: The edge width is broadened if the focal-point position is deviated in the −direction, whereas the change in the electron-beam image is small if the focal-point position is deviated in the +direction.

Although the cases illustrated in FIGS. 1A, 1B, and 1C are of the rhombus configurations, the above-described tendencies ① and ② also hold. The behaviors of the electron-beam images of the N pattern/the P pattern with respect to the focal-point position deviation, which have been illustrated in FIG. 1B, are the appearances of the tendencies ① and ②.

Next, the explanation will be given below concerning the reason why there occurs the above-described phenomenon: Namely, in the N pattern, the inverse taper appears in the −focal-point position deviation and the forward taper appears in the +focal-point position deviation, whereas, in the P pattern, the relation opposite to this holds. The case where this phenomenon becomes conspicuous is a case where the pattern width (i.e., d in FIG. 4A and FIG. 5A) is proximate to an image-resolution limit by the exposure apparatus. Namely, if the pattern width is proximate to the image-resolution limit, influences by the diffraction light make the effective light-intensity different from the light-intensity of the irradiation light. Incidentally, the image-resolution limit R, which is not a certain fixed value, is represented by the following expression 1:

$$R = k \cdot \lambda / NA \quad \text{(expression 1)},$$

where $\lambda$, k, and NA denote the exposure wavelength, the process factor, and the NA of the projection lens, respectively.

FIGS. 6A, 6B, and 6C and FIGS. 7A, 7B, and 7C illustrate the results obtained by inspecting the differences between the light-intensities by simulations. FIGS. 6A, 6B, and 6C illustrate the simulation result in the N pattern.

The N pattern is formed using a narrow-aperture mask pattern as illustrated in FIG. 6A. A reference numeral 505 and a reference numeral 506 denote a region that is light-shielded not to be irradiated with the light and a region that is irradiated with the light, respectively. FIGS. 6B and 6C illustrate the light-intensity distributions in the portion surrounded by the dashed line in FIG. 6A. In FIGS. 6B and 6C, the relative light-intensities in the case of defining the light-intensity of the irradiation light to be 1 are expressed by the light-and-dark of the color. The lighter the color grows, the higher the light-intensities become.

FIG. 6B and FIG. 6C illustrate the case of the −focal-point position deviation and that of the +focal-point position deviation, respectively. In general, the wider the aperture grows, the higher the light-intensities become. Accordingly, in the N pattern formed using the narrow-aperture mask pattern, the light-intensities are relatively low. As a consequence, a position becoming the boundary of the dissolution/non-dissolution of the resist is sifted in the pattern's central direction (i.e., the dropout pattern's central direction) in which the light-intensities are higher (i.e., the color is lighter on the drawings). This is the reason why, in the N pattern, the inverse taper appears in the −focal-point position deviation and the forward taper appears in the +focal-point position deviation.

Figure 7A:
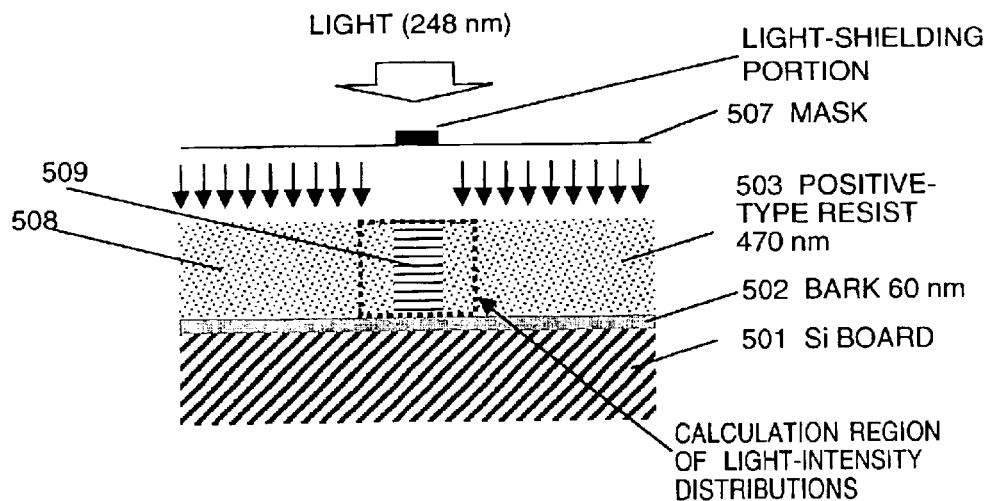
FIGS. 7A, 7B, and 7C are diagrams for illustrating the principle of the relationship between the deviation in the focal-point position and the change in the cross-section configuration in the P pattern.
Figures 7B, 7C:
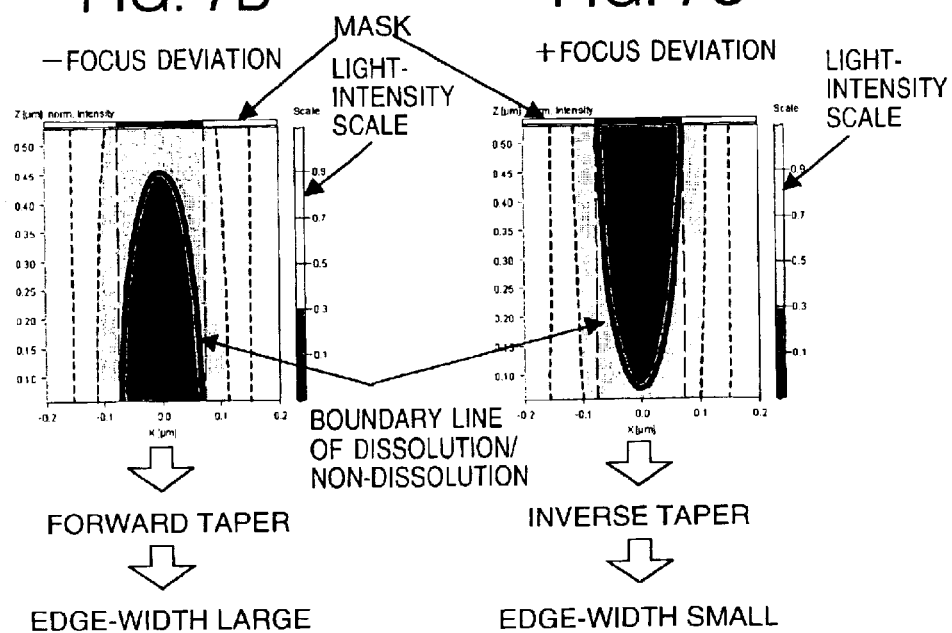

Meanwhile, the P pattern is formed using a wide-aperture mask pattern as illustrated in FIG. 7A. A reference numeral 508 and a reference numeral 509 denote a region that is irradiated with the light and a region that is light-shielded not to be irradiated with the light, respectively. FIGS. 7B and 7C illustrate the light-intensity distributions in the portion surrounded by the dashed line in FIG. 7A. As is the case with FIGS. 6A, 6B, and 6C, the lighter the color grows, the higher the light-intensities become.

FIG. 7B and FIG. 7C illustrate the case of the −focal-point position deviation and that of the +focal-point position deviation, respectively. In general, the wider the aperture grows, the higher the light-intensities become. Accordingly, in the P pattern formed using the wide-aperture mask pattern, the light-intensities are relatively high. As a consequence, a position becoming the boundary of the dissolution/non-dissolution of the resist is sifted in the pattern's central direction (i.e., the remaining pattern's central direction) in which the light-intensities are lower (i.e., the color is darker on the drawings). This is the reason why, in the P pattern, the forward taper appears in the −focal-point position deviation, and the inverse taper appears in the +focal-point position deviation.

Incidentally, in both the N pattern and the P pattern in FIG. 1, the regions wider than the image-acquiring ranges (i.e., 105, 106) are set up as the special-purpose patterns. This is because, since the distance at which the influence by the diffraction light occurs is equal to 1 to 2 $\mu$m, it is wished to exclude an influence by some other pattern existing on the surroundings of the special-purpose patterns.

Figure 4C:
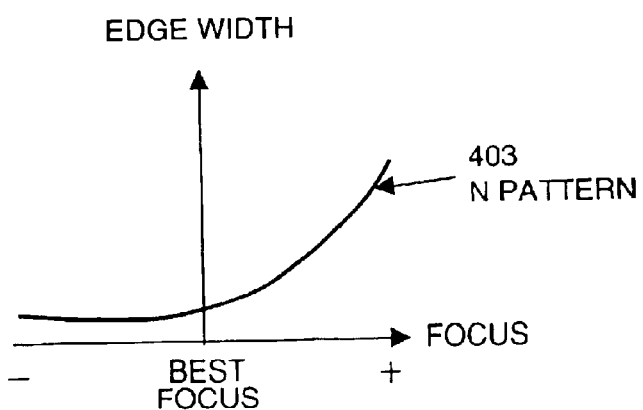

(ii) Aim with which there is Used Pattern on which Effective Exposure Quantities Differ Depending on Places In the N pattern illustrated in FIG. 4, or in the P pattern illustrated in FIG. 5, the effective exposure quantities are identical to each other at whatever place on the line. In the case of the rhombus illustrated in FIG. 1, however, the effective exposure quantities differ depending on the places. Here, the explanation will be given regarding an aim with which there is used a pattern on which the effective exposure quantities differ depending on the places.

In the projection exposure through a mask, as the mask's aperture ratio on the unit-area basis becomes higher, the effective exposure quantity is increased. In the positive-type resist, it turns out that, seeing from a local viewpoint, the effective exposure quantity is larger at a place where the area ratio occupied by the resist on the unit-area basis is lower. Consequently, in the N pattern in FIG. 1, the effective exposure quantity at a tip-edge portion of the rhombus is smaller as compared with the one at the central portion thereof. Also, in the P pattern, the effective exposure quantity at a tip-edge portion of the rhombus is larger as compared with the one at the central portion thereof.

Figure 8:
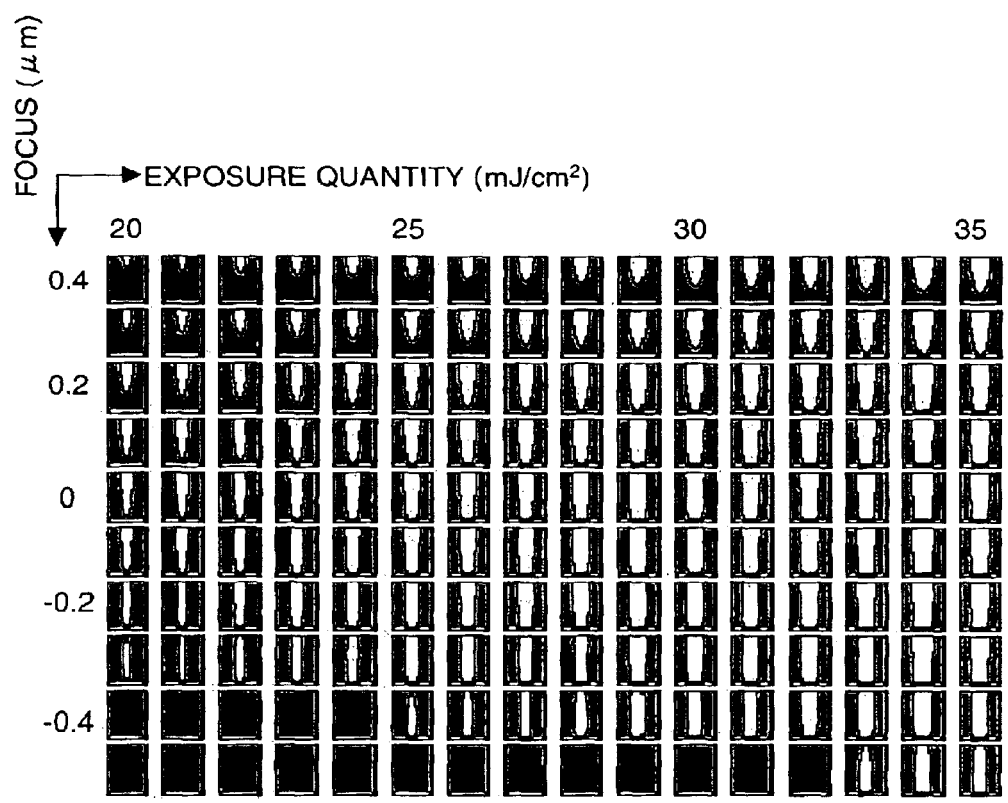
FIG. 8 is a diagram for illustrating (the exposure quantity, the focal-point position) vs. the cross-section configuration of the N pattern.

FIG. 8 illustrates the result obtained by performing the simulation on a change in the cross-section configuration of the N pattern when the exposure quantity and the focal-point position are varied. As illustrated in the same drawing, when the exposure quantity is small, the change in the cross-section configuration is tremendous with respect to even the slightest focal-point position deviation and, finally, the pattern itself vanishes. Meanwhile, when the exposure quantity is large, the change in the cross-section configuration is small with respect to the focal-point position deviation.

Now, a range of the focal-point position deviation in which the pattern does not vanish will be referred to as "a focal-point-position-deviation detection range". Taking advantage of this term, in the N pattern, the larger the exposure quantity grows, the longer the focal-point-position-deviation detection range becomes. Here, as is apparent from FIG. 8, the reason why the focal-point-position-deviation detection range is long is that the change in the configuration is small with respect to the focal-point position deviation. However, the sensitivity for the focal-point-position-deviation detection is low (∵ the focal-point position deviation is detected from the change in the configuration). The reason is as follows why the focal-point-position-deviation detection sensitivity becomes lower as the exposure quantity grows larger: The behavior peculiar to the N pattern (i.e., the inverse taper appears in the −focus deviation, and the forward taper appears in the +focus deviation) is derived from a condition that the effective light-intensity is low.

Making the effective light-intensity lower requires that the pattern size be made smaller. Namely, it turns out that a pattern size that allows a focal-point-position-deviation detection sensitivity to be obtained at an exposure quantity e i+$\alpha$($\alpha$>0) is equal to d i−$\beta$($\beta$>0) ($\alpha$ and $\beta$ are certain constants). Here, the focal-point-position-deviation detection sensitivity is equivalent to a focal-point-position-deviation detection sensitivity at an exposure quantity e i that allows a certain pattern size d i to be obtained. The reason is as follows why there is used the pattern on which the effective exposure quantities differ depending on the places: The necessary focal-point-position-deviation detection sensitivity can be maintained whatever value the initial condition E0 (i.e., the value described in the prior arts) of the exposure quantity has been set up to be, and afterwards, whether the exposure quantity will be varied in the increasing direction or in the decreasing direction.

The use of the pattern on which the effective exposure quantities differ depending on the places makes it possible to acquire the focal-point-position-deviation detection sensitivity at some place or other on the pattern. Also, taking another point-of-view, this can say that both the existence of a small effective-exposure-quantity place and that of a large effective-exposure-quantity place make detectable both a small focal-point position deviation and a large focal-point position deviation (∵ At the former, although the small focal-point position deviation can be detected, the focal-point-position-deviation detection range is short. At the latter, although the sensitivity is lacking for the detection of the small focal-point position deviation, the focal-point-position-deviation detection range is long).

Figure 9:
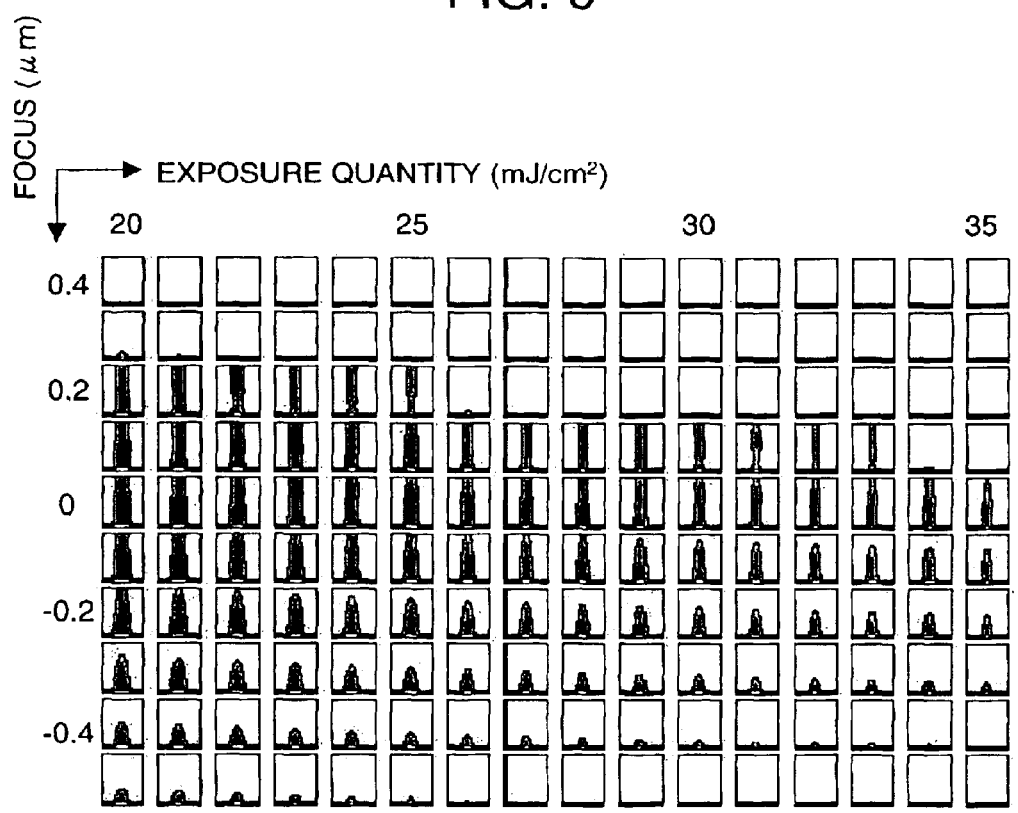
FIG. 9 is a diagram for illustrating (the exposure quantity, the focal-point position) vs. the cross-section configuration of the P pattern.

The case of the P pattern is basically the same as that of the N pattern. FIG. 9 illustrates the result obtained by performing the simulation on a change in the cross-section configuration of the P pattern when the exposure quantity and the focal-point position are varied. As illustrated in the same drawing, when the exposure quantity is large, the change in the cross-section configuration is tremendous with respect to even the slightest focal-point position deviation and, finally, the pattern itself vanishes. Meanwhile, when the exposure quantity is small, the change in the cross-section configuration is small with respect to the focal-point position deviation.

The smaller the exposure quantity grows, the longer the focal-point-position-deviation detection range becomes, which means that the case of the P pattern is opposite to that of the N pattern. However, as is apparent from FIG. 9, when the exposure quantity is small, the sensitivity for the focal-point-position-deviation detection is low (∵ the focal-point position deviation is detected from the change in the configuration). The reason is as follows why the focal-point-position-deviation detection sensitivity becomes lower as the exposure quantity grows smaller: The behavior peculiar to the P pattern (i.e., the forward taper appears in the −focus deviation, and the inverse taper appears in the +focus deviation) is derived from a condition that the effective light-intensity is high.

Making the effective light-intensity higher requires that the pattern size be made smaller. Namely, it turns out that a pattern size that allows a focal-point-position-deviation detection sensitivity to be obtained at an exposure quantity e i–α(α>0) is equal to d i–β(β>0). Here, the focal-point-position-deviation detection sensitivity is equivalent to a focal-point-position-deviation detection sensitivity at an exposure quantity e i due to a certain pattern size d i.

Whatever value the initial condition E0 (i.e., the value described in the prior arts) of the exposure quantity has been set up to be, and afterwards, whether the exposure quantity will be varied in the increasing direction or in the decreasing direction, in order to maintain the necessary focal-point-position-deviation detection sensitivity, in the P pattern as well as the N pattern, it is desirable to use the pattern on which the effective exposure quantities differ depending on the places.

Figure 10A:
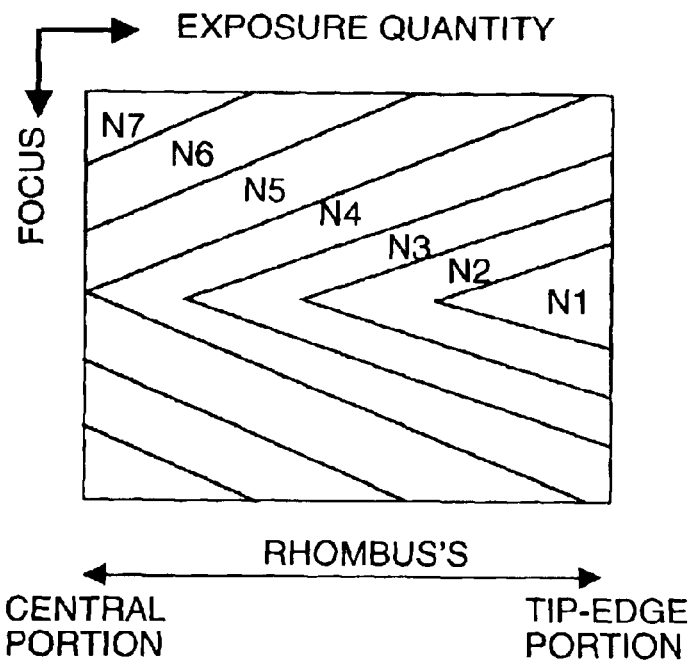
FIGS. 10A and 10B are diagrams for illustrating which region on an (E, F) matrix each of places will be in charge of when using a pattern for which the effective exposure quantities differ from each other depending on the places.

FIG. 10A is a conceptual diagram for illustrating, in the N pattern, in which region on the FE Matrix a small effective-exposure-quantity location to a large effective-exposure-quantity location (i.e., N1 to N7) are effective for the focal-point-position-deviation detection. In the rhombus configuration illustrated in FIGS. 1A, 1B, and 1C, a tip-edge portion of the rhombus corresponds to N1, and the central portion of the rhombus corresponds to N7. As shown from the same drawing, in the large exposure-quantity region (i.e., the right-side region in the drawing), the small effective-exposure-quantity location (i.e., a tip-edge portion of the rhombus 101 in FIGS. 1A, 1B, and 1C) is effective for the focal-point-position-deviation detection. Meanwhile, in the small exposure-quantity region (i.e., the left-side region in the drawing), the large effective-exposure-quantity location (i.e., the central portion of the rhombus 101 in FIGS. 1A, 1B, and 1C) is effective for the focal-point-position-deviation detection.

Figure 10B:
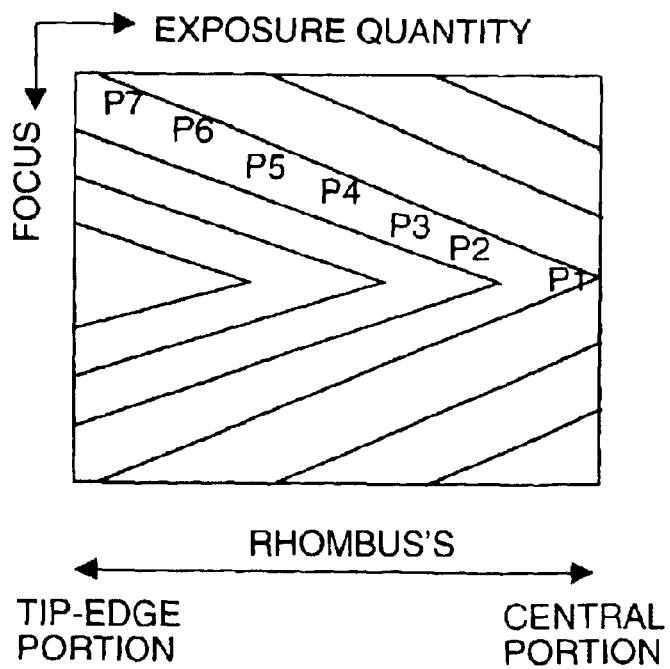

FIG. 10B is a conceptual diagram for illustrating, in the P pattern, in which region on the FE Matrix a large effective-exposure-quantity location to a small effective-exposure-quantity location (i.e., P1 to P7) are effective for the focal-point-position-deviation detection. In the small exposure-quantity region (i.e., the left-side region in the drawing), the large effective-exposure-quantity location (i.e., a tip-edge portion of the rhombus 102 in FIGS. 1A, 1B, and 1C) is effective for the focal-point-position-deviation detection. Meanwhile, in the large exposure-quantity region (i.e., the right-side region in the drawing), the small effective-exposure-quantity location (i.e., the central portion of the rhombus 102 in FIGS. 1A, 1B, and 1C) is effective for the focal-point-position-deviation detection.

(4) Creating Method of Model Data in the First Embodiment

Figure 12A:
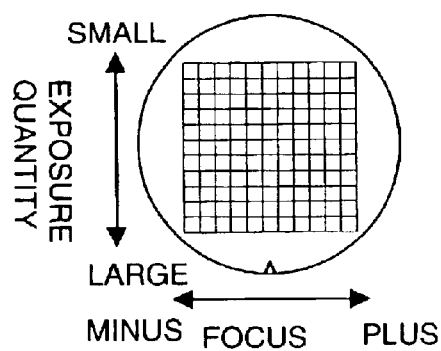
FIGS. 12A and 12B are the diagrams for illustrating the schematic diagram of the FEM wafer and the configuration of the model data.
Figure 12B:
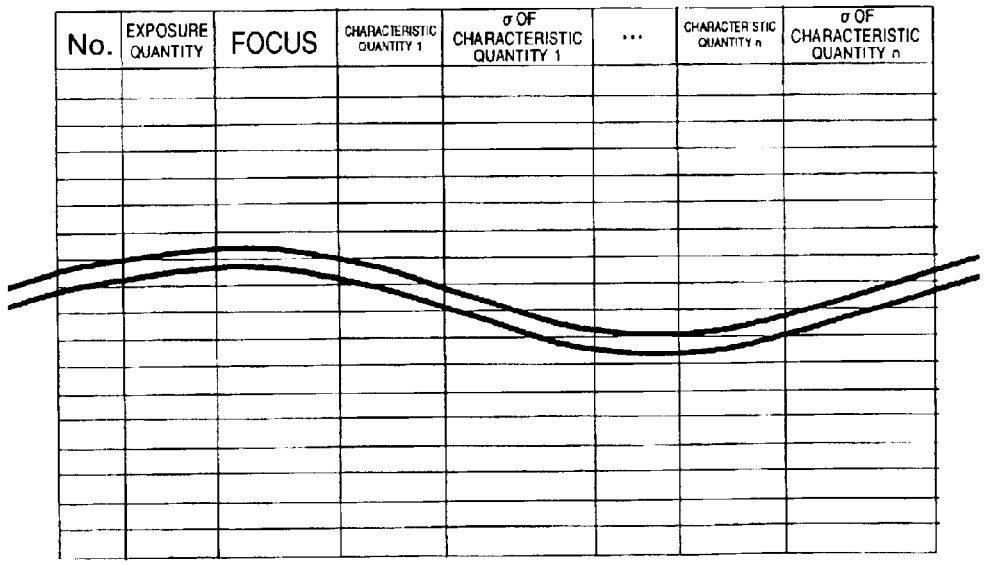

Next, the explanation will be given below concerning a method of creating the model data to be used at the step 2003 in FIG. 2. In the present embodiment, prior to the introduction of a product wafer, the electron-beam images (i.e., the secondary-electron images acquired by the length-measuring SEM) at the various exposure quantities and the various focal-point positions are acquired using the FEM wafer (refer to FIG. 12A). Next, the characteristic quantities are calculated from the electron-beam images, thereby creating in advance the model data as illustrated in FIG. 12B. As having been explained in "Description of the Prior Art", when starting to manufacture a new product or the like, the FEM wafer has been formed for "the condition-submitting work". Accordingly, it is advisable to create the model data by using the same FEM wafer.

FIG. 11 illustrates the creation flow of the model data.

Although the present embodiment assumes that the condition-submitting work has been carried out prior to the creation of the model data, it is also allowable to simultaneously perform the image acquisition for the model-data creation and the image acquisition for the condition-submitting work.

At first, a user specifies a recipe for the model-data creation (step 801). The works hereinafter will be automatically performed on the length-measuring SEM in accordance with information described in the recipe. The FEM wafer is loaded (step 802), and the wafer alignment is performed based on the optical image (step 803). If the position of the wafer has been determined, the stage is displaced to a 1st image-acquiring location (step 804). Here, the electron-beam image with an intermediate magnification is acquired, then performing the position detection of the special-purpose patterns by a template matching or the like (step 805).

The intermediate magnification, which refers to a magnification lower than, e.g., 50000 times, is the magnification of an order with which both the N pattern and the P pattern illustrated in FIG. 1A are permitted to enter the field-of-view. If the positions of the special-purpose patterns have been determined, the image of the N pattern is acquired with a predetermined magnification (step 806), then being stored (step 807). The range surrounded by the frame 105 in FIGS. 1A, 1B, and 1C is the image size of the N pattern. Subsequently, the image of the P pattern is acquired with a predetermined magnification (step 808), then being stored (step 809). The range surrounded by the frame 106 in FIGS. 1A, 1B, and 1C is the image size of the P pattern.

The repetition of the above-described steps 804 to 809 makes it possible to acquire the images of the N pattern and the P pattern at the respective points (E, F) on the FEM wafer (step 810). Incidentally, between the step 804 and the step 809, the deflection position of the electron beam is changed (i.e., image shift) without displacing the stage, thereby modifying the image-acquiring location. This makes it possible to avoid a decrease in the throughput caused by the stage displacement.

Also, in addition to the special-purpose patterns, a position-detecting pattern may also be provided within the field-of-view of the intermediate magnification. It is desirable that the position-detecting pattern (, unlike the special-purpose patterns,) should not change in the configuration if the exposure condition is changed. Consequently, the condition of an appropriate position-detecting pattern is that the line width or the like is large enough as compared with the exposure wavelength, and that the configuration is unique so that no error-recognition will ever occur.

After finishing the acquisition of the images of the N pattern and the P pattern, the size characteristic quantities of these patterns are calculated (step 811). FIG. 14 illustrates a method of calculating the size characteristic quantities. This calculation method is common to the N pattern and the P pattern.

FIG. 14(a) schematically illustrates an acquired image. As having been explained earlier, a taper portion of a secondary-electron image is detected bright, and a flat portion thereof is detected dark. At first, the edge detection is performed on the 4 sides of the rhombus (FIG. 14(b)), and straight lines are applied to these edge-detected 4 sides, then defining, as a reference line, the line resulting from connecting the intersection points of the straight lines (FIG. 14(c)). Moreover, the rhombus is divided with a predetermined spacing from the reference line (FIG. 14(d)). In addition, the average of the line width and that of the edge width are determined on each divided-region basis, then defining, as the size characteristic quantities, these averages on each divided-region basis (FIG. 14(e)). Since, in this case, the rhombus has been divided into the 8 regions, the 8 line widths and the 8 edge widths have been calculated. Here, the reference line has been determined in order that the absolute positions of the divided regions will always be made equal to each other. Additionally, the characteristic quantities calculating method illustrated in FIG. 14 is just one example, and thus the calculating method is not limited thereto. The point is that, since the manner in which the exposure condition variation will appear differs depending on the places on the pattern, it is advisable to employ a characteristic quantities calculating method that allows the quantification of this manner.

Figure 15A:
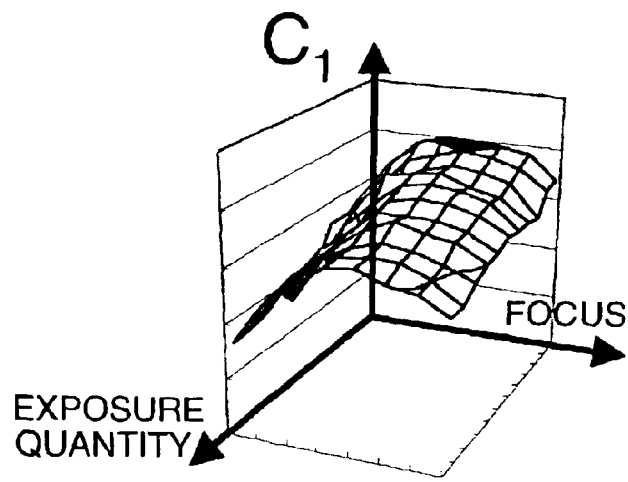
FIGS. 15A, 15B, and 15C are diagrams for explaining the smoothing and the interpolation of the size characteristic quantities.
Figure 15B:
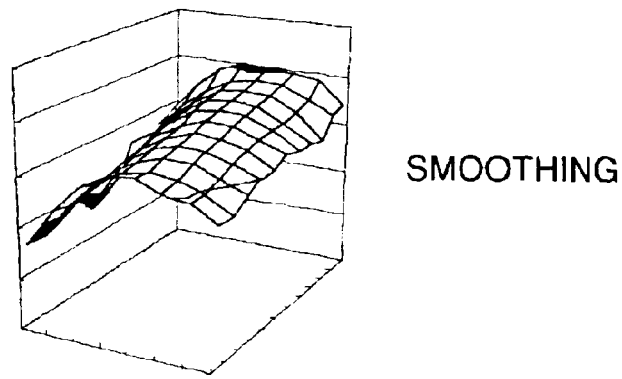
Figure 15C:
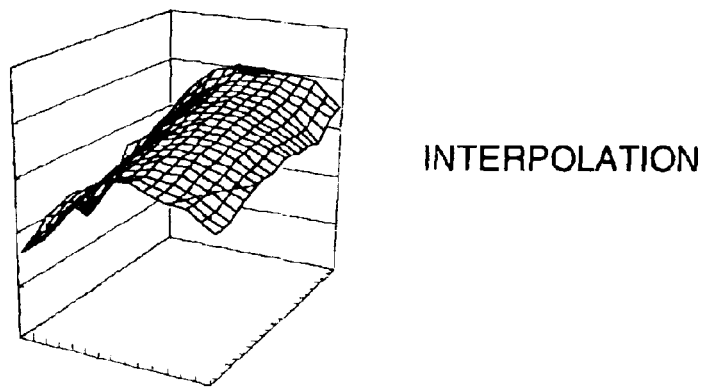

After calculating the size characteristic quantities from the electron-beam images acquired at the respective points (E, F) on the FEM wafer, the smoothing and the interpolation of these data are performed (step 812). FIGS. 15A, 15B, and 15C illustrate the manner of the smoothing and that of the interpolation. FIG. 15A illustrates the original data. Microscopic asperities of the data due to the measurement error are removed by taking an average with the data in proximity thereto or the like (FIG. 15B). After that, the data is interpolated by a technique such as the linear interpolation, thereby creating data whose separation-width is finer than the separation-width of the (E, F) on the FEM wafer (FIG. 15C). Otherwise, an appropriate curve expression may be applied to the original data in FIG. 15A.

Subsequently, the measurement errors of the size characteristic quantities at the respective points (E, F) are calculated (step 813). If it is possible to acquire a large number of images at the respective points (E, F), the measurement errors are obtained by calculating the characteristic quantities from the respective images and acquiring the standard deviations thereof. Otherwise, a value resulting from multiplying the general length-measuring error of the length-measuring SEM by an appropriate coefficient may be used as the substitute (e.g., if the nominal length-measuring error is equal to 2 nm, 2 nm multiplied by 2 is 4 nm, which is defined as the substitute). These measurement errors are used at a step 815 that will be described later, or in the application of the size characteristic quantities to the model data (step 2003 in FIG. 2). The model data includes the size characteristic quantities and the measurement errors thereof at the respective points (E, F) calculated at the step 812 and the step 814 (refer to FIG. 12B). Then, the size characteristic quantities and the measurement errors thereof are stored (step 814), which terminates the creation itself of the model data.

What is performed at the subsequent step 815 is the self-check, i.e., the confirmation of the model data by the trails of the exposure-quantity-deviation detection and the focal-point-position-deviation detection based on the size characteristic quantities at the respective points (E, F).

Additionally, in the example in FIG. 11, the characteristic quantities have been calculated (i.e., step 811) from the images stored (i.e., step 809). However, by limiting the electron-beam scanning positions to the positions at which the characteristic quantities are determined, it also becomes possible to simplify the image acquisition to mere line profiles acquired at the scanning positions. For example, instead of acquiring the images, only the positions of the characteristic quantities detection positions (i.e., 0 to 7) indicated in FIG. 14(d) are scanned using the electron beam. Then, from the line profiles obtained at that time, the characteristic quantities (e.g., the line widths and the edge widths) at the respective positions can be determined. Doing in this way makes it possible to save a time for the image processing or the like, thereby allowing an enhancement in the entire processing speed.

Figure 16:
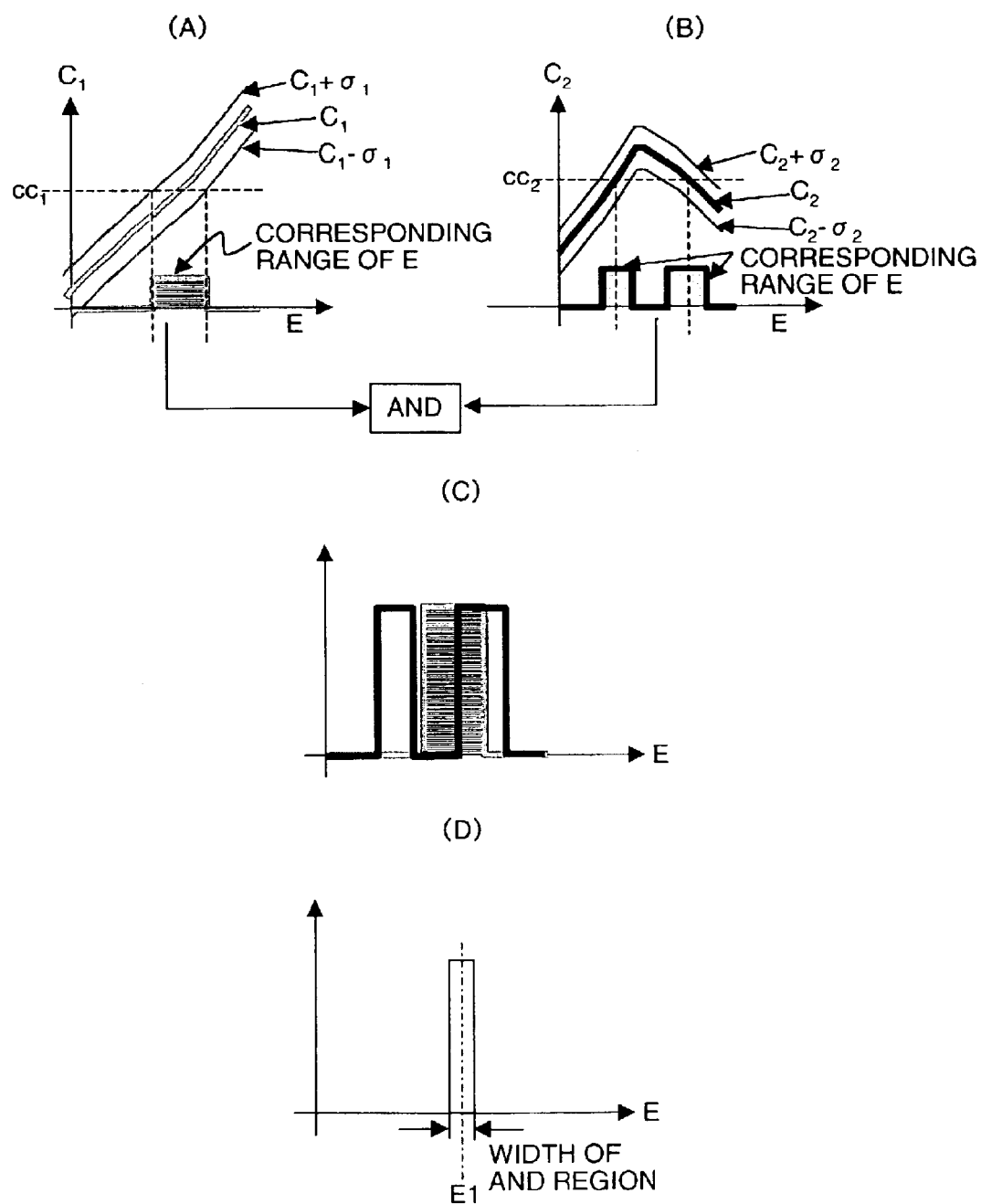
FIG. 16 is a diagram for explaining the method of calculating the exposure quantity from the size characteristic quantities.

FIG. 16 illustrates a detecting method of the exposure quantity deviation, or a one of the focal-point position deviation. Actually, the size characteristic quantities have the values for the respective points (E, F) as illustrated in FIG. 15(c). In FIG. 16, however, the 2-dimensional coordinate representation is introduced by taking the exposure quantity (E) as the transverse-axis for simplicity (i.e., the focal-point position axis is omitted). In FIG. 16(a), the boldface line denotes the value of a characteristic quantity $C_1$, and the lightface lines above and below the boldface line denote a range within which $C_1$ is varied by a measurement error i.e., the measurement error of the size characteristic quantity calculated at the step 813. Although, in FIG. 16, the measurement error is set up as a fixed value $\sigma_1$, the measurement error might be different depending on the exposure quantity.

When the value of the characteristic quantity $C_1$ is equal to $cc_1$, the value of a characteristic quantity $C_2$ is equal to $cc_2$, ..., the value of a characteristic quantity $C_n$ is equal to $cc_n$, as illustrated in FIG. 16(a) or FIG. 16(b), at first, the corresponding range of the exposure quantity (E) and the corresponding range of the focal-point position (F) are determined within which the values of the characteristic quantities are equal to $cc_1$, ..., $cc_n$ (in FIG. 16, the corresponding range of E alone). The corresponding range becomes 1 location if the characteristic quantity is monotonously increased or decreased. In some cases, however, there occur a plurality of corresponding-range locations if there exist an increase and a decrease in the characteristic quantity as is illustrated in FIG. 16(b). Also, the corresponding range is narrow if the change ratio of the characteristic quantity is large (i.e., if the inclination of the graph is large), whereas the corresponding range is wide if the change ratio is small (i.e., if the inclination of the graph is small). The narrower the corresponding range grows, the higher the sensitivity for the E/F detection becomes.

After determining the corresponding range of the E/F on each characteristic-quantity basis (in FIG. 16, the corresponding range of E alone), the AND operation of these corresponding ranges is executed (FIG. 16(c)), thereby determining the value of the E/F. Of a large number of characteristic quantities (e.g., in FIG. 14, there exist the 16 characteristic quantities in total), some characteristic quantities have wider corresponding ranges, and others have narrower ones. Here, the execution of the AND operation automatically gives a higher-priority to a size characteristic quantity whose corresponding range is narrower (=the sensitivity for the E/F detection is higher) on each occasion basis. Consequently, the user need not give consideration as to in what manner which of the characteristic quantities should be used.

As illustrated in FIG. 16(d), the value of the determined E/F has a certain finite width. For this width to grow narrower means that the ambiguity degree of the calculation result of the E/F becomes smaller.

As the detection result of the exposure quantity deviation, or that of the focal-point position deviation, the median of the above-described finite width and the width thereof are outputted. The self-check at the step 815 in FIG. 11, in response to a user's request, presents the calculation result of the ambiguity degree at all the points (E, F), or the ambiguity degree at a specific point (E, F) specified by the user (if the condition-submitting work has been carried out in advance, the process window of the (E, F) has been made already-known, and a range in which the variation in the (E, F) is to be monitored has also been made apparent).

Even if one and the same special-purpose pattern has been used, depending on the process conditions such as a material of the resist to be used and the baking temperature, the detection accuracy of the exposure quantity deviation and that of the focal-point position deviation are changed. The utilization of the above-described self-check function makes it possible to beforehand recognize with what extent of accuracy the exposure condition can be controlled with respect to the target process. As a result, it becomes possible to design the execution values (i.e., the gain values) of the feed-back control by the APC controller 2008 in FIG. 2. These execution values are represented by the following expressions, for example:

$$\Delta E = g1 \cdot \Delta e = f(a1) \cdot \Delta e \qquad \text{(expression 2)}$$

$$\Delta F = g2 \cdot \Delta f = f(a2) \cdot \Delta f \qquad \text{(expression 3)}$$

Here, ΔE and ΔF denote the correction quantity to the exposure quantity and the one to the focal-point position, which are to be feed-backed to the exposure apparatus. Moreover, Δe and Δf denote the deviation quantity in the exposure quantity and the one in the focal-point position that are determined by making the comparison between the measured characteristic quantities and the lookup table created from the measurement result of the FEM sample. In addition, g1 and g2 denote the gain values at the time when the feed-back is actually performed. Also, these gain values are expressed by f (a1) and f (a2), i.e., functions of a1 and a2 that are the ambiguity degrees of Δe and Δf. These functions f (a1) and f (a2) may be functions represented by the following expressions, for example:

$$f(a1) = k11 \cdot (1 - a1/k12) \qquad \text{(expression 4)}$$

$$f(a2) = k21 \cdot (1 - a2/k22) \qquad \text{(expression 5)},$$

where k11, k12, k21, and k22 denote arbitrary coefficients.

As shown by these expression 2, expression 3, expression 4, and expression 5, the more the ambiguity degrees increase, the smaller the gain values become. This condition makes it possible to avoid an excess feed-back attributed to an insecure estimated value.

(5) Details of Exposure-Condition Monitoring in the First Embodiment

Subsequently, going back to FIG. 2, the explanation will be supplemented regarding the steps 2001 to 2008.

The object of the present invention is as follows: The initial values (E0, F0) of the exposure quantity and the focal-point position set up when starting to manufacture a product wafer are gradually deviated from the optimum values by the influences of the process variations. In the present invention, this deviation is detected. Then, based on this result, the exposure condition of the exposure apparatus is corrected, thereby always maintaining the process in the best state.

It is desirable that the special-purpose patterns illustrated in FIG. 1 should be provided at a plurality of locations within 1 shot as illustrated in FIGS. 17A and 17B. FIGS. 17A and 17B illustrate the case where there are included the 4 dies within the 1 shot, and the special-purpose patterns are provided at the 4 corners of the 1 shot and the center thereof. The special-purpose patterns may be provided in the scribe area. At the step 2001 in FIG. 2, with respect to a plurality of shots, there are acquired the electron-beam images of the N patterns and the P patterns of the special-purpose patterns included in each shot.

The flow of the electron-beam image acquisition is basically the same as the one explained at the steps 803 to 810 in FIG. 11. At the step 2002, the size characteristic quantities of all the electron-beam images are calculated using the same method as the one that has created the model data (e.g., the method illustrated in FIG. 14). If the exposure condition is common to the respective points on the wafer, it is necessary to determine the exposure-condition feed-back quantities Δe and Δf that are common to the respective points on the wafer. Accordingly, the average of the size characteristic quantities obtained from all the images is determined.

Assuming that, e.g., the 9 shots exist on the wafer and the 5 special-purpose patterns exist for each shot, the average value of the 45 size characteristic quantities is determined. At the subsequent step 2003, in accordance with the same processing step as the self-check of the model data carried out at the step 815 in FIG. 11 (refer to FIG. 16), the above-described size characteristic quantities are applied to the in-advance created model data. This allows the determination of the AND region obtained from each size characteristic quantity on each exposure-quantity and focal-point-position basis. Incidentally, as the size-characteristic-quantities measurement error to be used at this time, the value on the model data may be used. Otherwise, the standard deviation of the size characteristic quantities is determined simultaneously with the determination of the above-described average value. Then, the standard deviation may be multiplied by 3 or the like so as to be used as the size-characteristic-quantities measurement error that is common to all of the E/F regions.

If there exist the AND regions for both the exposure quantities and the focal-point positions, the processing proceeds to the step 2006. At the step 2006, the median of the AND region and, as the ambiguity degree, the width of the AND region are calculated on each exposure-quantity and focal-point-position basis. The subtractions between the existing exposure quantities and the above-described medians are Δe and Δf. Also, if there exists none of the AND regions, it indicates that an unexpected process variation has occurred. Accordingly, the processing proceeds to the step 2005, where the alarm is issued.

Having taken into consideration the progression of the exposure-condition variations from the past (FIG. 17C), the calculated exposure-condition variations Δe and Δf this time, and the above-described ambiguity degrees, the APC controller 2008 determines the feed-back quantity ΔE of the exposure quantity to the exposure apparatus and the feed-back quantity ΔF of the focal-point position thereto. For example, the feed-back quantities may be determined by selecting the inverse of the ambiguity degree as the weight to average the exposure quantities and the focal-point positions of the past-number lot. Meanwhile, if the ambiguity degree exceeds a prescribed value, the determination of the feed-back quantities is automatically stopped, and the alarm to a process technician is called at the same time.

(6) Effects of the First Embodiment

The present embodiment is capable of solving the 3 problems described in "Description of the Prior Art". At first, with respect to the 1st problem, i.e., the overlook of the focal-point position variation, the present embodiment monitors the edge widths from the SEM images of the N pattern and the S pattern, thereby allowing the implementation of a secure detection of the focal-point position deviation.

With respect to the second problem, i.e., the feed-back of the focal-point position variation, the present embodiment makes it possible not only to detect the presence or absence of the focal-point position deviation, but also to calculate an accurate focal-point position deviation quantity by applying the size characteristic quantities to the model data. In particular, the present embodiment uses the patterns on which the effective exposure quantities differ depending on the places. This makes it possible to maintain the necessary focal-point-position-deviation detection sensitivity whatever value the initial condition E0 (i.e., the value described in the prior arts) of the exposure quantity has been set up to be, and afterwards, whether the exposure quantity will be varied in the increasing direction or in the decreasing direction. Also, taking another point-of-view, there exist both a small effective-exposure-quantity place and a large effective-exposure-quantity place. This allows the calculation of an accurate focal-point position deviation quantity whether the focal-point position deviation to be calculated is a small one or a large one.

With respect to the third problem, i.e., the information for indicating the process variations in a quantitative manner, the present embodiment applies the size characteristic quantities to the model data, thereby making it possible to determine the accurate deviation quantity in the exposure quantity and the one in the focal-point position. This, eventually, allows a proactive prevention of the configuration failure of the after-etched film pattern.

Also, the present embodiment outputs what extent of error the calculation result of the exposure quantity deviation or that of the focal-point position deviation has contained. This makes it possible to prevent a situation of blindly complying with the calculation result to execute a false feed-back.

Still also, at the stage where the model data has been created, the present embodiment indicates what extent of accuracy the exposure-condition control using the model data has. Accordingly, it becomes possible to write a scenario of the exposure-condition control prior to the introduction of a product. This results in an effect of being capable of saving a waste by a trial-and-error such as a test run after the introduction of the product.

Figure 18:
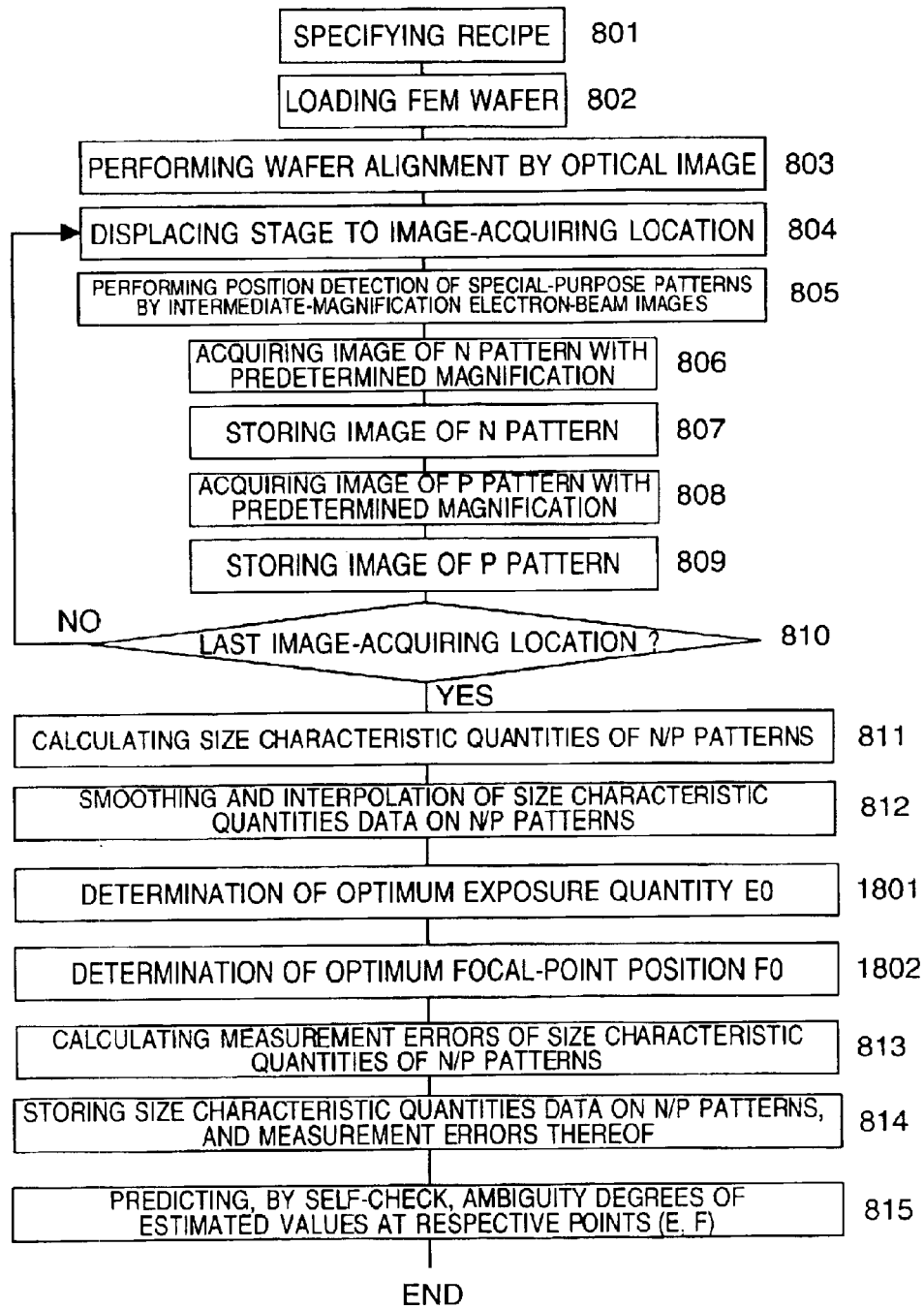
FIG. 18 is a diagram for illustrating another flow for the model-data creation.
Figure 19A:
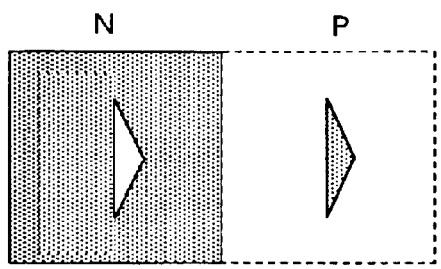
FIGS. 19A, 19B, 19C, 19D and 19E are diagrams for illustrating another example of the pattern suitable for the exposure-condition variation monitoring related to the first embodiment.
Figure 19B:
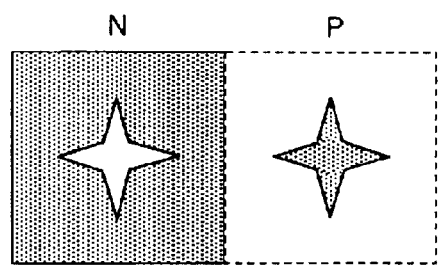
Figure 19C:
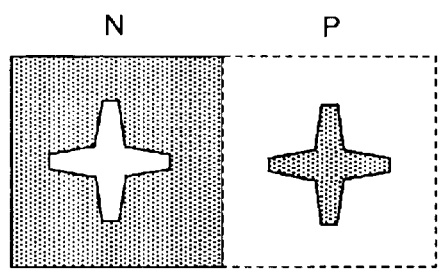
Figure 19D:
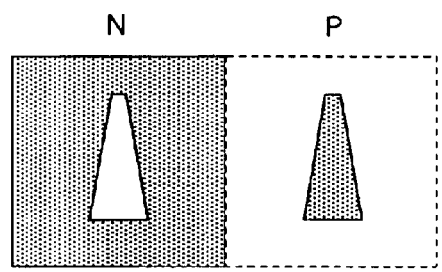
Figure 19E:
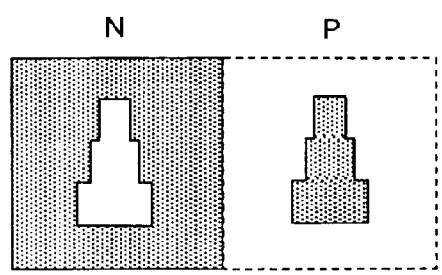
Figure 30A:
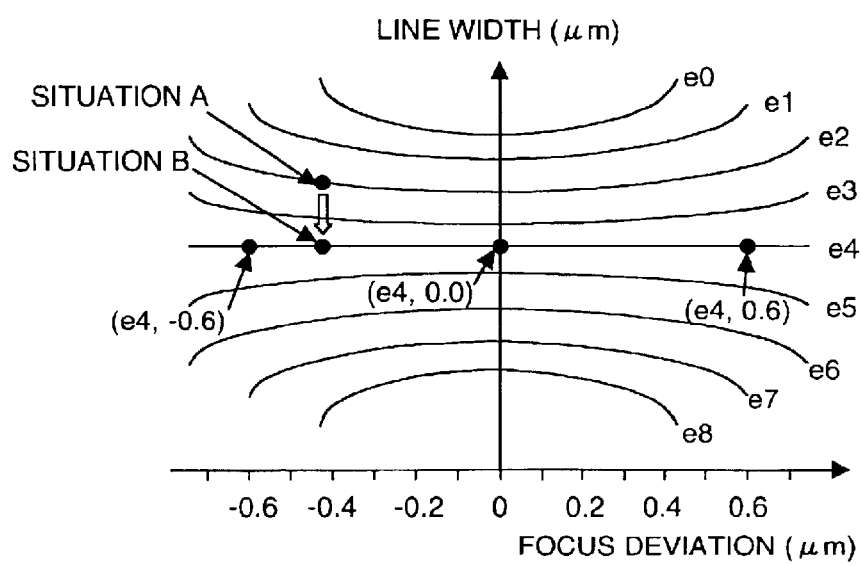
FIGS. 30A and 30B are the graphs for illustrating the relationship among the exposure quantity, the focal-point position, and the line width.
Figure 30B:
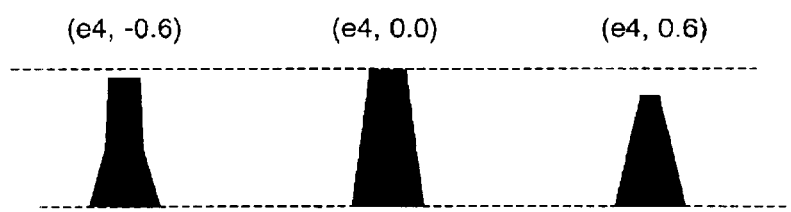

(7) Supplements to the First Embodiment (i) Although, in the explanation so far, it has been assumed the special-purpose patterns are specially used for the detection of the exposure-condition variation, the special-purpose patterns may also be used for the determination or the confirmation of the initial condition E0 of the exposure quantity and the initial value F0 of the focal-point position. In this case, as illustrated in FIG. 18, a step 1801 of determining E0 and a step 1802 of determining/confirming F0 are added to the creation flow of the model data (FIG. 11). Conventionally, E0 and F0 have been determined mainly based on the size-measured result of the FEM wafer as illustrated in FIG. 30. In proximity to the process window, however, a change in the size to the focal-point position is slow. This has resulted in a problem that it is difficult to determine the best focal-point position.

Of the size characteristic quantities of the special-purpose patterns, taking advantage of, e.g., the edge width of the N pattern and that of the P pattern, a focal-point position at which both of the edge widths become smaller than a constant value is defined as the best focus. This definition permits the best focus to be determined with a high-accuracy. Also, this definition becomes a solution of the problem that, in the conventional condition-submitting work, the determination of the best focus has been influenced by the subjectivity of a worker in charge.

(ii) Although the rhombus illustrated in FIG. 1 has been proposed as the special-purpose patterns, the special-purpose patterns are not limited to this configuration. Whatever patterns are acceptable as long as they are included in the category of a combination of the N pattern and the P pattern of a configuration on which the effective exposure quantities differ depending on the places. FIGS. 19A, 19B, 19C, 19D and 19E illustrate variations of the special-purpose patterns. The size characteristic quantities in both the x-axis direction and the y-axis direction are calculated using FIGS. 19A, 19B, 19C, 19D and 19E, then comparing the calculated values with each other. This operation is also effective in measuring astigmatisms of the lenses in the exposure apparatus.

(iii) The following description has been given earlier: Between the step 804 and the step 809 in FIG. 11, in order to avoid the decrease in the throughput, the image-acquiring location is modified by the image shift without displacing the stage. The range in which the image shift is executable, i.e., the range in which the electron-beam deflection is executable, is, basically, a certain fixed-radius circle. Consequently, it is desirable that a special-purpose pattern (or a special-purpose pattern group) should be located so as to be positioned within this circle. Also, the image of a background portion where there exists no pattern is not necessarily required. Accordingly, if the position of a pattern has been found out at the step 805, it is also allowable to selectively perform an electron-beam scanning of the pattern portion.

(8) The Second Embodiment

Figure 20A:
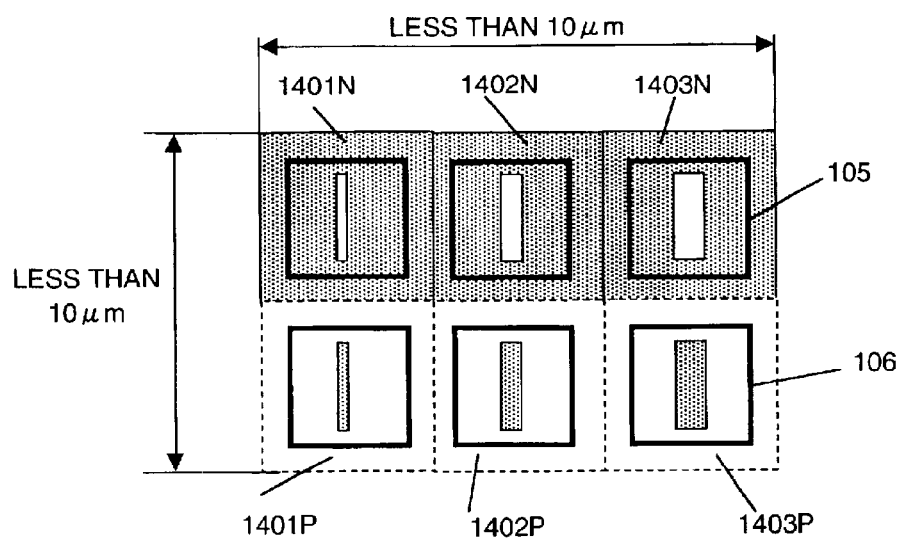
FIGS. 20A, 20B, and 20C are diagrams for illustrating another example of a pattern suitable for the exposure-condition variation monitoring related to the second embodiment.
Figure 20B:
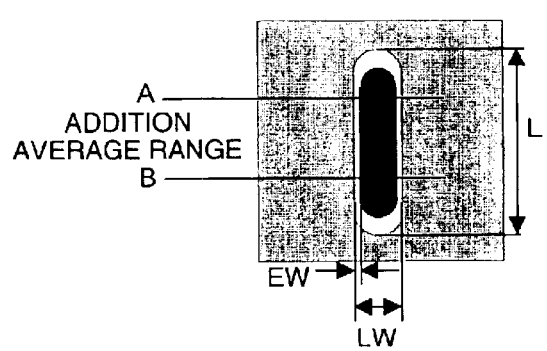
Figure 20C:
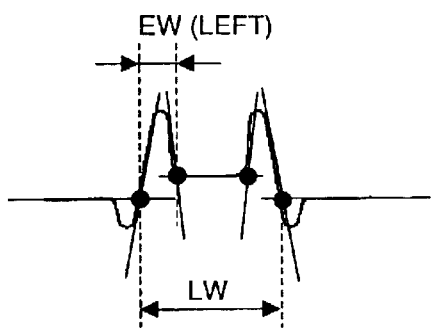

In the 1st embodiment, there have been used the patterns as illustrated in FIGS. 1A, 1B, and 1C or FIGS. 19A, 19B, and 19C on which the effective exposure quantity differs continuously on one and the same image. In the 2nd embodiment, however, the following method is employed: There are provided beforehand a plurality of patterns whose effective exposure quantities differ from each other, then selecting a necessary pattern out of the plurality of patterns. FIGS. 20A, 20B, and 20C illustrate typical examples of special-purpose patterns to be used in the 2nd embodiment. Here, 3 types of isolated lines whose line widths differ from each other are located for each of the N pattern and the P pattern.

The large-or-small relationship among the effective exposure quantities is as follows: 1041N<1042N<1043N in the N pattern, and 1041P>1042P>1043P in the P pattern. Trying to acquire all these images leads to the acquisition of 6 electron-beam images in total (reference numerals 105 and 106 denote the size of 1 electron-beam image). However, since it is satisfying enough to detect the exposure quantity variation and the focal-point position variation in proximity to the process window, all the images are not necessarily used.

Also, instead of acquiring the images, the electron beam of the length-measuring SEM is scanned in agreement with the arrangement direction of the plurality of patterns. This allows a profile of the plurality of patterns to be obtained at the same time. From this profile, the necessary size characteristic quantities can be obtained directly. Namely, arranging the patterns effectively within the scanning range by the electron beam makes it possible to omit the image acquisition and an image processing of the image, thereby allowing the entire processing time to be shortened tremendously. In the present embodiment, when creating the model data, the selection of a necessary image is performed. FIG. 21 illustrates the flow of the model-data creation.

Steps 2001 to 2003 in FIG. 21 are the same as the steps 801 to 803 (FIG. 11) in the 1st embodiment. If the position of the wafer has been determined, the stage is displaced to a 1st image-acquiring location (step 2005). Here, the electron-beam image with an intermediate magnification is acquired, then performing the position detection of the special-purpose patterns by a template matching or the like (step 2006).

If the positions of the special-purpose patterns have been determined, the electron-beam image of a 1st (i=1) special-purpose pattern (e.g., 1401N in FIGS. 20A, 20B, and 20C) is acquired with a predetermined magnification (step 2007), then being stored (step 2008). The repetition of the above-described steps 2005 to 2008 makes it possible to acquire the images of the 1st (i=1) special-purpose pattern at the respective points (E, F) on the FEM wafer (step 2009).

After finishing the acquisition of the images, the size characteristic quantities at the respective points (E, F) on the FEM wafer are calculated (step 2010), then performing the smoothing and the interpolation of the data (step 2011). As the size characteristic quantities, there are determined, e.g., the line length L, the line width LW, and the edge width EW illustrated in FIG. 20B.

Concerning the line width LW and the edge width EW, an addition average is performed regarding the cross-section waveforms in the range of A to B in FIG. 20B. After that, as illustrated in, e.g., FIG. 20C, straight lines are applied to the outer-side portions of the peaks, the base portions thereof, the inner-side portions thereof, and the portion between the right and the left peaks. Then, the line width LW and the edge width EW are calculated from the intersection points (i.e., the black circles) of these straight lines.

The calculation method of the line length L is basically the same as the calculation method of the line width LW. The smoothing and the interpolation of the data are performed in much the same way as at the step 812 in FIG. 11. Subsequently, the measurement errors of the size characteristic quantities at the respective points (E, F) are calculated (step 2012). This step is basically the same as the step 813 in FIG. 11.

At a step 2013, the ambiguity degree at all the points (E, F) is presented to the user. Here, using the size characteristic quantities calculated until this point-in-time, the ambiguity degree is calculated in much the same way as the case of the self-check at the step 815 in FIG. 11. For example, it is assumed that the step 2013 at this point-in-time is at a stage where the electron-beam image of 1401N, that of 1401P, and that of 1402N in FIGS. 20A, 20B, and 20C have been acquired in i=1, i=2, and i=3, respectively. In this case, the ambiguity degree at the respective points (E, F) is calculated, using all or a part of 9 size characteristic quantities calculated from these 3 electron-beam images (in the case where the 3 size characteristic quantities of L, LW, and EW have been calculated from each electron-beam image).

Figure 22:
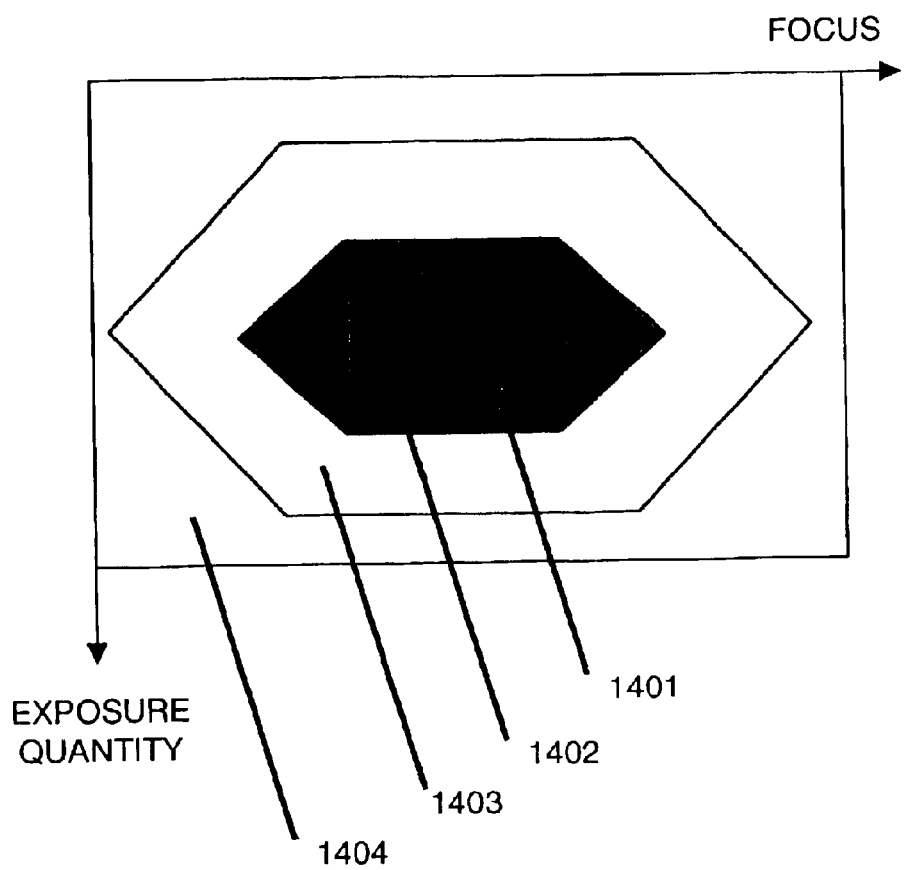
FIG. 22 is a diagram for illustrating one example of the ambiguity-degree map related to the second embodiment.

The calculation result is displayed on a GUI picture as a contour-line map of the ambiguity degree as illustrated in FIG. 22. In FIG. 22, the large-or-small of the ambiguity degree is expressed by the light-and-dark of the color (the 4 gradations are assumed for simplicity).

The user compares the ambiguity-degree map with the process window of the exposure quantity and the focal-point position at the target step (step 2014). If the user has judged that there exists no problem from a practical standpoint (yes branch at step 2015), the creation of the model data is terminated.

Meanwhile, if the user has judged that the ambiguity degree is large and thus the detection accuracies of the exposure quantity deviation and the focal-point position deviation are lacking (no branch at step 2015), the processing proceeds to the electron-beam image acquisition (step 2016→step 2005) at the next point (e.g., 1402P in FIG. 20A).

Figure 23A:
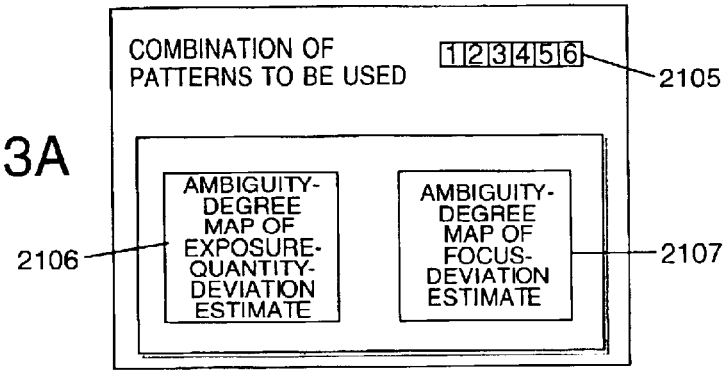
FIGS. 23A, 23B, and 23C are diagrams for illustrating one example of the GUI picture related to the second embodiment.

FIG. 23 illustrates examples of the GUI pictures at the steps 2013 and 2014. In FIG. 23A, if, using a field 2105, the user specifies 1 or more numbers of the special-purpose patterns to be used, the GUI picture displays an ambiguity-degree map 2106 of the exposure quantity deviation and an ambiguity-degree map 2107 of the focal-point position deviation which correspond to this combination. From this displayed result, the user makes the judgement at the step 2015.

Figure 23B:
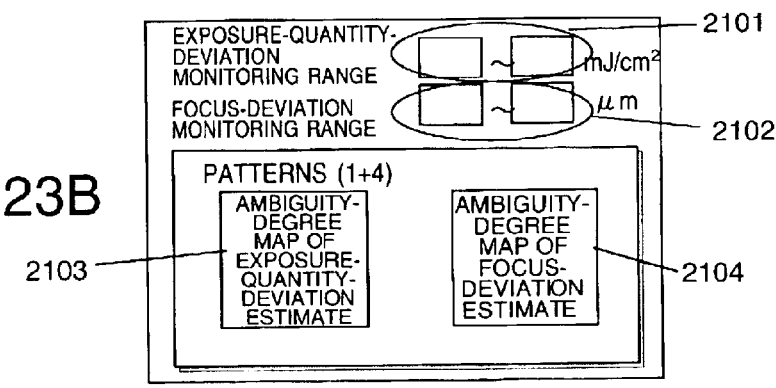

Also, in FIG. 23B, if, using a field 2101 and a field 2102, the user specifies a range in which the exposure quantity deviation should be monitored and a range in which the focal-point position deviation should be monitored, respectively, the GUI picture displays an ambiguity-degree map 2103 of the exposure quantity deviation and an ambiguity-degree map 2104 of the focal-point position deviation which are based on a combination of the special-purpose patterns covering the ranges. From this displayed result, the user makes the judgement at the step 2015.

Figure 23C:
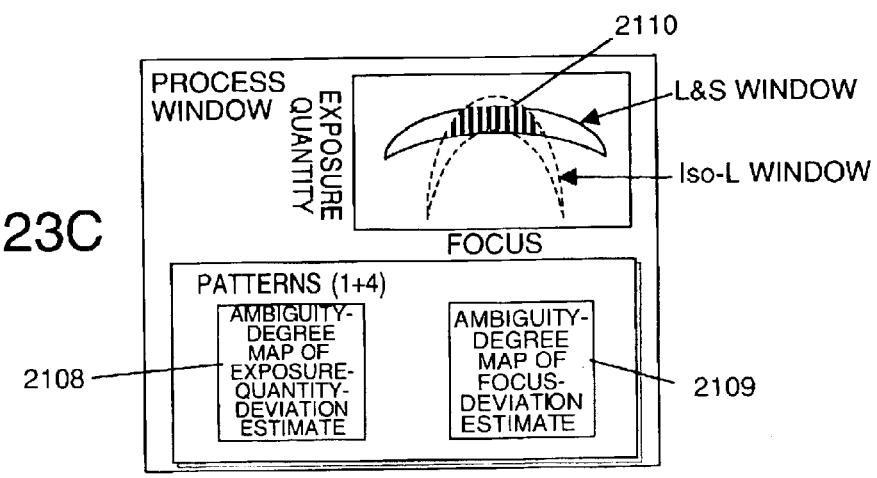

Still also, FIG. 23C displays an ambiguity-degree map 2108 of the exposure quantity deviation and an ambiguity-degree map 2109 of the focal-point position deviation which are based on a combination of the special-purpose patterns covering the range of a process window 2110 (in many cases, the process window is defined as a region that is an overlap between a region where the CD value of an L&S pattern falls within a prescribed range: a region surrounded by the solid line, and a region where the CD value of an isolated-line pattern falls within a prescribed range: a region surrounded by the dashed line).

The explanation given so far is about the model-data creating method including the selection of a special-purpose pattern. The flow of the exposure-condition monitoring is basically the same as the case of the 1st embodiment illustrated in FIG. 2.

(9) Supplements to the Second Embodiment

Figure 24A:
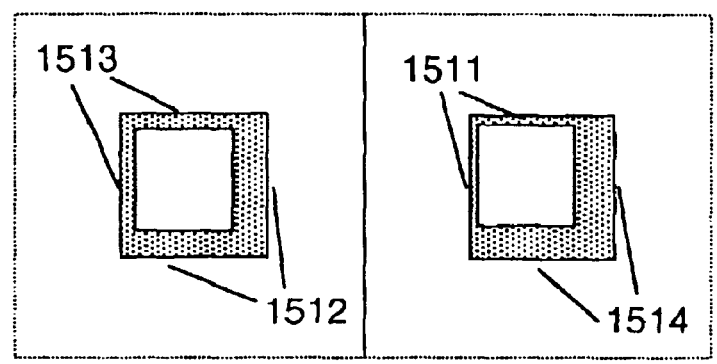
FIGS. 24A and 24B are diagrams for illustrating another example of the pattern suitable for the exposure-condition variation monitoring related to the second embodiment.

Although the isolated lines have been used in FIGS. 20A, 20B, and 20C, a character "□" pattern as illustrated in FIG. 24A may also be used. As illustrated in the same drawing, the outside of the character □ and the inside thereof are made eccentric. This results in an inclusion of 4 patterns whose effective exposure quantities differ from each other. Although the same drawing illustrates P patterns, the large-or-small relationship among the effective exposure quantities is 1511>1512>1513>1514. The isolated lines with the narrow line widths are more or less likely to collapse. The employment of the configuration in FIG. 24A, however, makes the collapse hard to occur. Since it is impossible to calculate the size characteristic quantities from a collapsed pattern, the pattern is employed which is hard to collapse. This also brings about an effect of enlarging the detection range of the exposure quantity variation or that of the focal-point position variation.

Figure 24B:
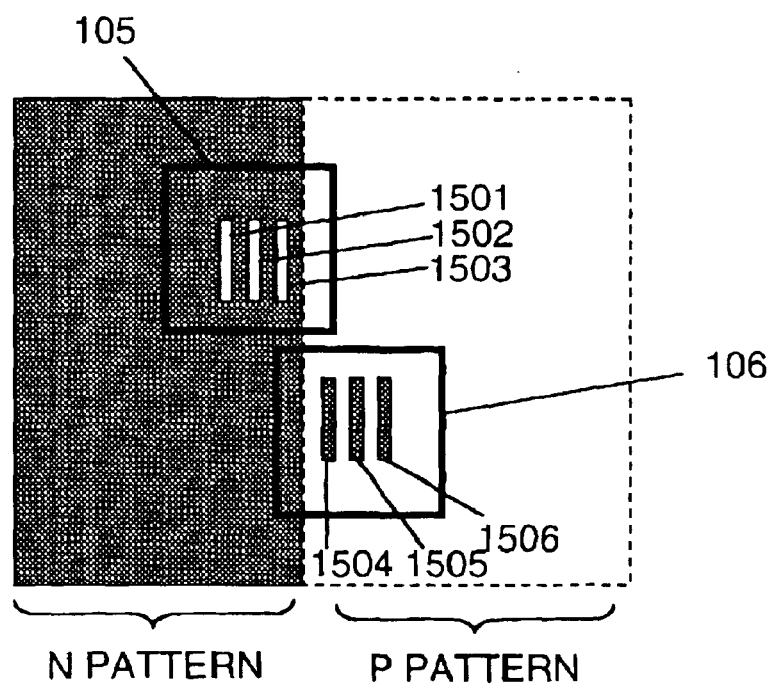
Figure 25:
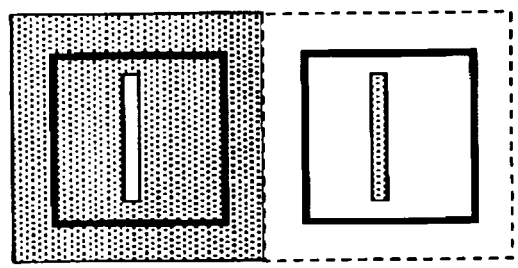
FIG. 25 is a diagram for illustrating a flow for determining the mask pattern related to a third embodiment.

Otherwise, a "line & space" pattern located as illustrated in FIG. 24B may also be used. Here, although 3 lines, i.e., 1501, 1502, and 1503, are given as N patterns, the large-or-small relationship among the effective exposure quantities becomes 1501<1502<1503. This is because a line nearer to the region where there exists no resist has a larger effective exposure quantity. Also, in the line 1503 itself, the right-edge portion has a larger effective exposure quantity than the left-edge portion has. Acquiring 105 as an N-pattern image and 106 as a P-pattern image is equivalent to the acquisition of a pattern that has a variety of effective exposure quantities.

(10) Effects of the Second Embodiment

It is apparent that the 2nd embodiment has basically the same effects as the ones in the 1st embodiment described in (7). In the second embodiment, there has been used the pattern on which the patterns whose effective exposure quantities differ from each other are provided at the different locations. This feature, in comparison with the first embodiment using the complicated pattern, brings about an advantage that the measurement errors of the size characteristic quantities become smaller. Consequently, the detection sensitivity of the exposure quantity deviation and that of the focal-point position deviation are higher than the ones in the first embodiment. Meanwhile, the detection range of the exposure quantity deviation and that of the focal-point position deviation become shorter as compared with the ones in the first embodiment. If, however, the ranges of the process variations are shorter as compared with the detection ranges, there exists no problem at all.

Incidentally, the above-described method has been employed where there are provided beforehand the plurality of patterns and then a necessary pattern is selected out of them. Accordingly, although it takes a longer time to create the model data, the time needed at the exposure-condition monitoring stage is the same as the one in the first embodiment.

(11) The Third Embodiment

In the first embodiment, there have been used the special-configuration pattern on which the effective exposure quantities differ depending on the places. In the second embodiment, the method has been employed where, instead of using such a pattern, a simple-configuration pattern that covers a range of the exposure-condition variation is determined experimentally. In the third embodiment, instead of experimentally determining the pattern that covers the range of the exposure-condition variation, the following method is employed: This pattern is determined using a simulation, and the result of this simulation is reflected on the mask design.

The optimum exposure quantity is an exposure quantity that, with a wider focal-point-position-deviation margin, allows a pattern of the limit size on the circuit pattern to become a size that is exactly as it was designed. At first, the definitions are given as to what type of pattern the limit-size pattern is: ① if the limit-size pattern is an isolated-line pattern, its pattern width is defined, ② if the limit-size pattern is of a densely-formed pattern portion, the pattern width and the pattern spacing are defined, ③ if the limit-size pattern is a contact-hole pattern, the pattern diameter and the hole location are defined (step 2501). Next, letting the pattern width/diameter of the limit-size pattern be d, the exposure quantities and the focal-point positions are distributed on a lithography simulator regarding patterns of d±0, d±α1, d±α2, d±α3, . . . (α1 . . . αn: bias values), thereby determining the optimum exposure quantity that, with the wider focal-point-position-deviation margin, allows the acquisition of the size that is exactly as it was designed, the bias values, and the focal-point-position-deviation margin (step 2502).

Next, similarly by a simulation, the pattern specification of an N pattern and a P pattern capable of covering the exposure-quantity-deviation margin and the focal-point-position-deviation margin with the optimum exposure quantity taken as the center (step 2503). For example, when taking isolated lines as the example, as illustrated in FIG. 8 and FIG. 9, the simulation is performed regarding the cross-section configurations of the resist patterns of the N pattern and the P pattern when the exposure quantities and the focal-point positions are distributed. This simulation allows the determination of the line width with which the (E, F) range in which the patterns do not vanish and the forward taper appears will cover the above-described margins.

Based on the result obtained so far, the bias values determined at the step 2502 are applied to the circuit pattern, and the specification obtained at the step 2503 is applied to the special-purpose patterns, thereby designing the mask (step 2504).

According to the present embodiment, it is satisfying enough to provide only the minimum special-purpose patterns required. This feature brings about an advantage of being capable of making the special-purpose patterns more compact. Also, it is apparent that the time and labor need for the model-data creation is easier as compared with the ones in the first and the second embodiments. Additionally, since the mask design that utilizes the lithography simulation is now getting increasingly common, an overhead accompanying the carry-out of the present embodiment is not large at all.

(12) The Fourth Embodiment

In the first to the third embodiments, the use of the special-purpose pattern has been premised. In some cases, however, a pattern that can be expected to be substituted for a special-purpose pattern exists on the circuit pattern. In this case, before checking the specification of the special-purpose pattern, a checking is made as to whether or not the pattern that is appropriate for the detection of the exposure-condition variation exists on the circuit pattern.

Figure 26:
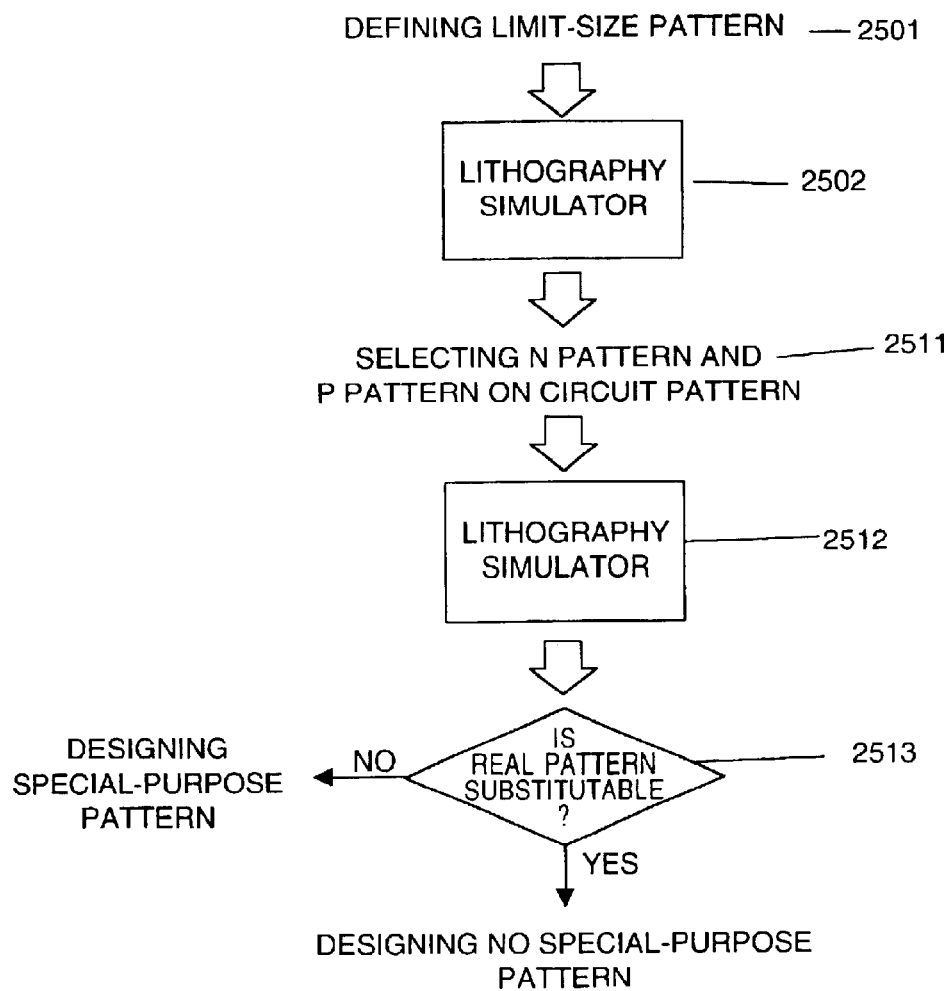
FIG. 26 is a diagram for illustrating a flow for determining the mask pattern related to the fourth embodiment.
Figure 27:
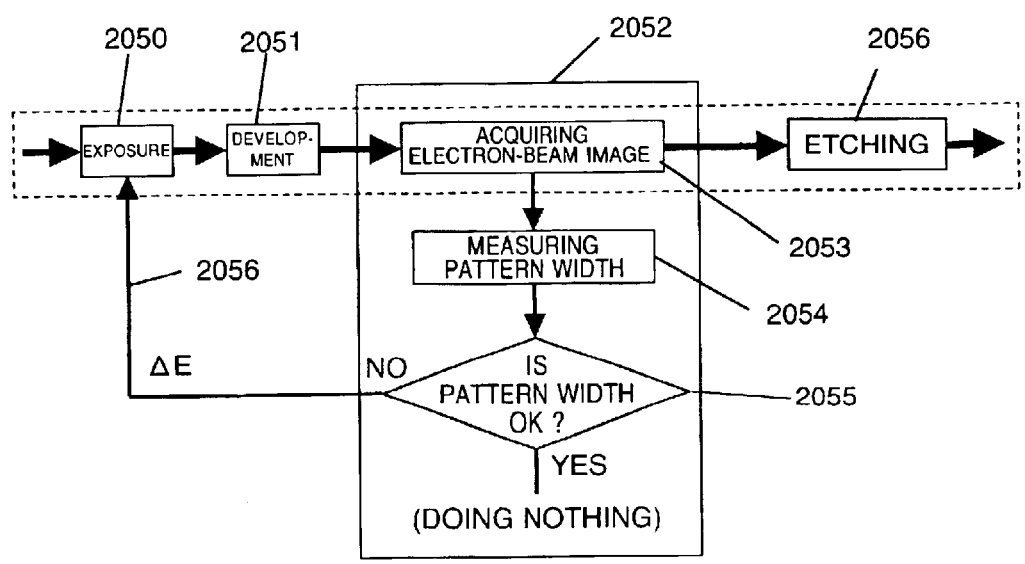
FIG. 27 is the diagram for illustrating the conventional lithography step.
Figure 28:
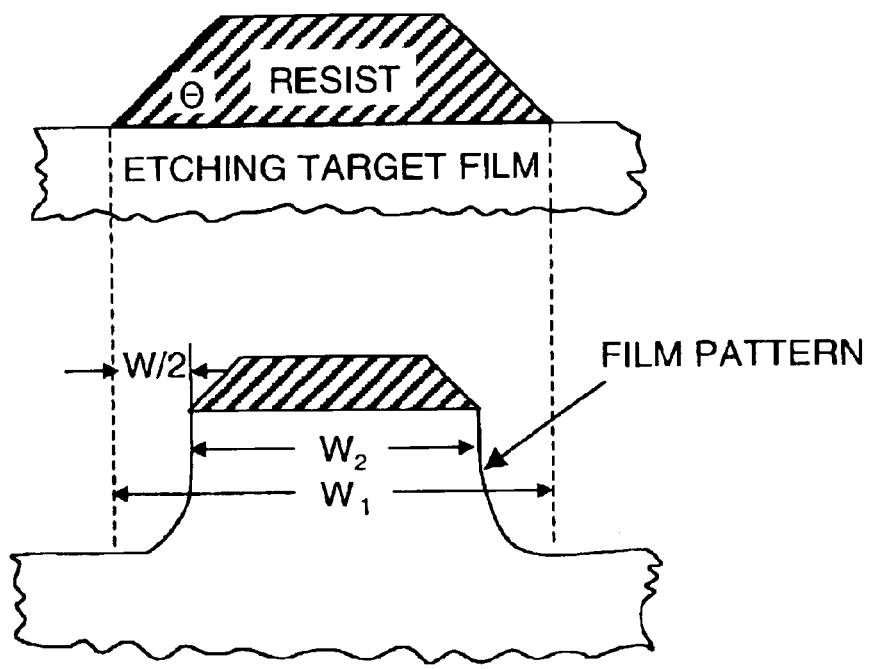
FIG. 28 is the schematic diagram for illustrating the relationship between the resist pattern and the film pattern before and after the etching.
Figure 29A:
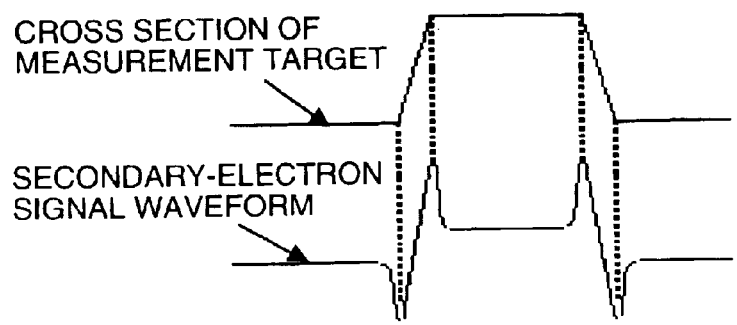
FIGS. 29A and 29B are the diagrams for illustrating the cross-section configuration of the resist and the signal intensity of the secondary electrons.
Figure 29B:
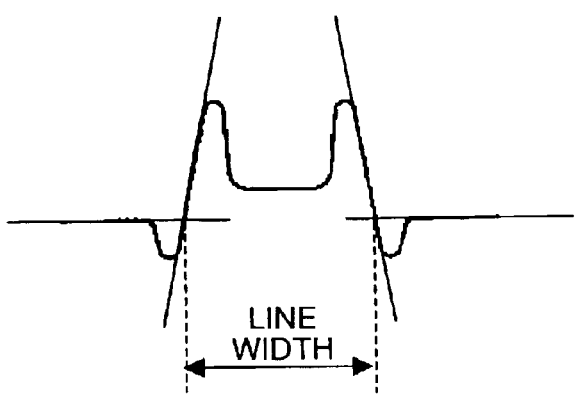

FIG. 26 illustrates the flow in the present embodiment. Steps 2501 and 2502 are basically the same as the ones in the third embodiment. At the step 2501, an N-pattern candidate and a P-pattern candidate are selected from the design information on the circuit pattern. Concerning the selection of the candidates, a pattern on which a ratio occupied by the resist on unit-area basis falls within a predetermined range may be automatically selected from the design information, or the pattern may be selected based on the judgement by the designer of the circuit pattern. In addition to this, the simulation is performed regarding the cross-section configurations of the resist patterns of the respective candidates when the exposure quantities and the focal-point positions are distributed. This simulation allows a checking to be made as to whether or not the (E, F) range in which the patterns do not vanish and the forward taper appears has covered desired margins. The special-purpose pattern is created only when the (E, F) range has not covered the desired margins (no branch at step 2513).

According to the present embodiment, there exists an advantage that no specific special-purpose pattern is required. Consequently, the present embodiment is effective in the case where there exists none of a space where a special-purpose pattern can be provided.

When the special-purpose pattern is not used, the recipe for the model-data creation is as follows: A non-special-purpose pattern is specified in the item number 1 in FIG. 13B, and the calculation method of the size characteristic quantities is specified in the item number 3.

(13) Supplements to Entire Embodiments

Here, the description will be given below concerning the supplemental items that are common to all of the first to the fourth embodiments.

(i) In order to determine the edge width from an electron-beam image with a higher-accuracy, an image may also be used which is acquired in a state of inclining the stage or the beam. This allows an enhancement in the observation accuracy of the pattern-edge portion.

The present invention allows not only the detection of the exposure quantity variation but also that of the focal-point position variation. At the same time, in addition to the detection, the present invention makes it possible to perform the exposure-condition variation monitoring that permits the output of the information for indicating the process variations in a quantitative manner, i.e., the accurate variation quantity in the exposure quantity and the one in the focal-point position. As a consequence, it becomes possible to detect an abnormality in the three-dimensional configuration due to the focal-point position deviation that has been overlooked in the conventional size measurement. This, eventually, makes it possible to prevent the manufacturing of a failure of the after-etched film pattern that cannot be reproduced.

The invention may be embodied in other specific forms without departing from the spirit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. A method of monitoring an exposure condition, comprising the steps of:

photographing a resist pattern using an electron microscope so as to obtain an electron-beam image of said resist pattern, said resist pattern having a configuration which is formed by being exposed under a predetermined exposure condition and on which effective exposure quantities differ depending on the places;

measuring, using said electron-beam image, a characteristic size of said resist pattern at a plurality of locations at which said effective exposure quantities differ from each other; and estimating deviation quantities in an exposure quantity and a focal-point position of said predetermined exposure condition from correct values by using information on model data created in advance and said information on said characteristic size measured at said plurality of locations at which said effective exposure quantities differ from each other, said model data causing various exposure conditions to be related with characteristic sizes of said resist pattern formed under said various exposure conditions.

2. The method of monitoring an exposure condition as claimed in claim 1, further comprising a step of estimating said deviation quantities in said exposure quantity and said focal-point position of said predetermined exposure condition from said correct values by further adding information on a measurement error of said characteristic size to said information on said model data and said information on said characteristic size measured at said plurality of locations.

3. The method of monitoring an exposure condition as claimed in claim 2, further comprising a step of further determining ambiguity degrees of said estimated deviation quantities.

4. A method of monitoring an exposure condition, comprising the steps of:

photographing plural types of resist patterns so as to obtain images of said plural types of resist patterns, said plural types of resist patterns having configurations which are formed by being exposed under a predetermined exposure condition and on which effective exposure quantities differ depending on the places;

processing said images so as to determine a characteristic size of each of said plural types of resist patterns at a plurality of locations on each of said plural types of resist patterns at which said effective exposure quantities differ from each other; and obtaining information on deviations in an exposure quantity and a focal-point position of said predetermined exposure condition from correct values by using information on model data created in advance and said information on said characteristic size determined at said plurality of locations at which said effective exposure quantities differ from each other, said model data causing characteristic sizes of each of said resist patterns formed under various exposure conditions to be related with said various exposure conditions.

5. The method of monitoring an exposure condition as claimed in claim 4, wherein said information on said deviations further includes information on an ambiguity degree of said information on said deviations.

6. The method of monitoring an exposure condition as claimed in claim 4, wherein said characteristic size of said each resist pattern includes any one of an edge width, a pattern width, a pattern length, and a pattern diameter of said each resist pattern.

7. The method of monitoring an exposure condition as claimed in claim 4, wherein said each resist pattern having said configuration on which said effective exposure quantities differ depending on said places has any one of the following characteristics (1) to (5):

(1) A set of a line pattern of a resist whose pattern width differs depending on its local positions and which is formed in a convex-shaped configuration on a semiconductor board, and a pattern opposite thereto, i.e., a concave-shaped space pattern whose pattern width differs depending on its local positions and which is formed by removing a resist from on a semiconductor board;

(2) A set of a plurality of isolated-line patterns of a resist whose pattern widths differ from each other and which are formed in a convex-shaped configuration on a plurality of semiconductor boards, and a pattern opposite thereto, i.e., a plurality of concave-shaped isolated-space patterns whose pattern widths differ from each other and which are formed by removing resists from on a plurality of semiconductor boards;

(3) A set of an arrangement of a plurality of line patterns whose pattern widths, whose pattern spacings, and/or whose pattern lengths differ from each other, and an arrangement of a plurality of space patterns opposite thereto;

(4) A set of a plurality of rectangle-shaped patterns whose pattern diameters differ from each other and which are formed by leaving resists in a convex-shaped configuration on a plurality of semiconductor boards, and a pattern opposite thereto, i.e., a plurality of concave-shaped rectangle-shaped patterns whose pattern diameters differ from each other and which are formed by removing resists from on a plurality of semiconductor boards;

(5) A set of a plurality of cylinder-shaped patterns whose pattern diameters differ from each other and which are formed by leaving resists in a convex-shaped configuration on a plurality of semiconductor boards, and a pattern opposite thereto, i.e., a plurality of concave-shaped hole patterns whose pattern diameters differ from each other and which are formed by removing resists from on a plurality of semiconductor boards.

8. A method of monitoring an exposure condition, comprising the steps of:

photographing a resist pattern using an electron microscope, thereby to obtain an image of said resist pattern, and processing said image so as to determine a characteristic size of said resist pattern, said resist pattern being formed using an exposure apparatus set up to be a predetermined exposure condition;

obtaining information on deviations in an exposure quantity and a focal-point position of said predetermined exposure condition from correct values of said exposure quantity and said focal-point position by using information on model data created in advance and said information on said determined characteristic size, said model data causing characteristic sizes of said resist pattern formed under various exposure conditions to be related with said various exposure conditions; and determining correction quantities to said exposure condition of said exposure apparatus on the basis of said information on said deviations.

9. The method of monitoring an exposure condition as claimed in claim 8, wherein said resist pattern has an acute-angle-like configuration portion in at least a part of said resist pattern.

10. The method of monitoring an exposure condition as claimed in claim 8, further comprising a step of obtaining not only said information on said deviations in said exposure quantity and said focal-point position from said correct values, but also information on an ambiguity of said information on said deviations.

11. The method of monitoring an exposure condition as claimed in claim 8, wherein said correction quantities to said exposure condition includes correction quantities to said exposure quantity and said focal-point position.

12. A method of manufacturing a semiconductor device, comprising the steps of:

exposing a resist-coated board under a predetermined exposure condition by using a mask, said mask being located such that its aperture ratio differs depending on the local positions on the mask pattern;

developing said board that has undergone said exposure step, and thereby forming, on said board, a resist pattern on which effective exposure quantities differ depending on the places;

photographing said resist pattern using an electron microscope so as to obtain an electron-beam image of said resist pattern; and performing an etching processing to said board on which said resist pattern has been formed, wherein said method of manufacturing a semiconductor device further comprises the steps of:

processing said electron-beam image of said resist pattern obtained at said step of obtaining said electron-beam image of said resist pattern, and determining, from said electron-beam image, a characteristic size of said resist pattern at a plurality of locations at which said effective exposure quantities differ from each other;

comparing said determined characteristic size of said resist pattern with information on model data created in advance, said model data causing various exposure conditions to be related with characteristic sizes of said resist pattern formed under said various exposure conditions; and thereby determining deviation quantities in an exposure quantity and a focal-point position of said predetermined exposure condition from correct values, and controlling said exposure condition at said exposure step on the basis of said determined deviation quantities.

13. The method of manufacturing a semiconductor device as claimed in claim 12, further comprising a step of determining not only said deviation quantities in said exposure quantity and said focal-point position of said predetermined exposure condition from said correct values, but also ambiguity degrees of said deviation quantities.

14. The method of manufacturing a semiconductor device as claimed in claim 12, wherein, on said resist pattern, said effective exposure quantities with which said exposure has been performed by said exposure apparatus differ depending on said places.

15. The method of manufacturing a semiconductor device as claimed in claim 12, wherein said resist patterns are formed in plural number within 1 exposure region of said exposure apparatus.

16. A method of manufacturing a semiconductor device, comprising the steps of:

exposing a resist, with which a board is coated, under conditions of a predetermined exposure quantity and a predetermined focal-point position by using an exposure apparatus;

developing said exposed resist thereby to form a resist pattern on said board;

photographing, using an electron microscope, said board on which said resist pattern has been formed, and obtaining an electron-beam image of said resist pattern;

processing said electron-beam image so as to determine a characteristic size of said resist pattern;

determining estimated values of deviations in the predetermined exposure quantity and the predetermined focal-point position of the exposure apparatus from correct values and ambiguity degrees of said estimated values, from information on model data created in advance and said information on said extracted characteristic size of said resist pattern, said model data causing various exposure conditions to be related with characteristic sizes of said resist pattern formed under said various exposure conditions;

determining correction quantities to said exposure quantity and said focal-point position of said exposure apparatus on the basis of said information on said determined estimated values of said deviations and said determined ambiguity degrees of said estimated values;

correcting said exposure quantity and said focal-point position of said exposure apparatus on the basis of said determined correction quantities; and exposing a resist, with which a new board is coated, by using said exposure apparatus having said corrected exposure quantity and said corrected focal-point position.

17. The method of manufacturing a semiconductor device as claimed in claim 16, wherein, on said resist pattern, said effective exposure quantities with which said exposure has been performed by said exposure apparatus differ depending on said places.

18. The method of manufacturing a semiconductor device as claimed in claim 16, wherein said resist patterns are formed in plural number within 1 exposure region of said exposure apparatus.

* * * * *